United States Patent
Ohto et al.

(10) Patent No.: US 6,939,777 B2
(45) Date of Patent: Sep. 6, 2005

(54) METHOD FOR MANUFACTURING SEMICONDUCTOR DEVICE

(75) Inventors: Kenichi Ohto, Tokyo (JP); Takashi Terauchi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/863,443

(22) Filed: Jun. 9, 2004

(65) Prior Publication Data

US 2005/0101107 A1 May 12, 2005

(30) Foreign Application Priority Data

Nov. 12, 2003 (JP) ......................................... 2003-382917

(51) Int. Cl.⁷ ............................................. H01L 21/76
(52) U.S. Cl. ..................... 438/401; 438/406; 438/424; 438/975
(58) Field of Search ............................... 438/401, 462, 438/975; 257/797

(56) References Cited

U.S. PATENT DOCUMENTS

| | | | |
|---|---|---|---|
| 5,889,335 A | 3/1999 | Kuroi et al. | |
| 6,127,737 A | 10/2000 | Kuroi et al. | |
| 6,194,287 B1 * | 2/2001 | Jang | 438/427 |
| 6,215,197 B1 * | 4/2001 | Iwamatsu | 257/797 |
| 6,218,262 B1 * | 4/2001 | Kuroi et al. | 438/401 |
| 6,232,200 B1 * | 5/2001 | Chu | 438/401 |
| 6,303,460 B1 * | 10/2001 | Iwamatsu | 438/401 |
| 6,395,617 B2 * | 5/2002 | Ando | 438/401 |
| 6,440,816 B1 * | 8/2002 | Farrow et al. | 438/401 |
| 6,573,151 B1 * | 6/2003 | Ramsbey et al. | 438/401 |
| 6,624,039 B1 * | 9/2003 | Abdelgadir et al. | 438/401 |
| 6,656,815 B2 * | 12/2003 | Coolbaugh et al. | 438/401 |
| 6,794,263 B1 * | 9/2004 | Lee et al. | 438/401 |
| 6,878,506 B2 * | 4/2005 | Tsubata | 430/311 |
| 2002/0005594 A1 * | 1/2002 | Iwamatsu | 257/797 |

FOREIGN PATENT DOCUMENTS

| | | |
|---|---|---|
| JP | 10-284704 | 10/1998 |
| JP | 11-087488 | 3/1999 |
| JP | 2000-114397 | 4/2000 |
| JP | 2000-292905 | 10/2000 |
| JP | 2001-102440 | 4/2001 |
| JP | 2002-134701 | 5/2002 |

* cited by examiner

*Primary Examiner*—Asok Kumar Sarkar
(74) *Attorney, Agent, or Firm*—Leydig, Voit & Mayer, Ltd.

(57) ABSTRACT

An alignment mark section on a semiconductor substrate has two grooves which are filled with silicon oxide. The surface of the portion of the semiconductor substrate sandwiched by these grooves is lower than other portions of the semiconductor substrate to produce a step having a predetermined depth in the alignment mark section.

5 Claims, 37 Drawing Sheets

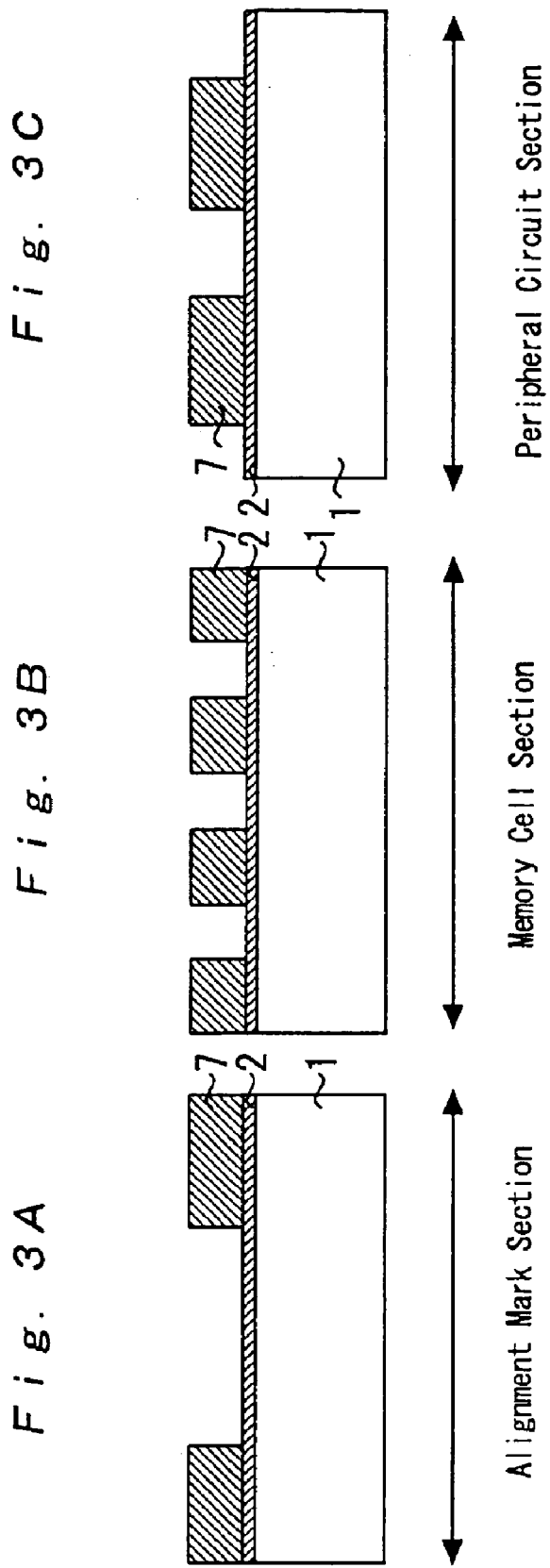

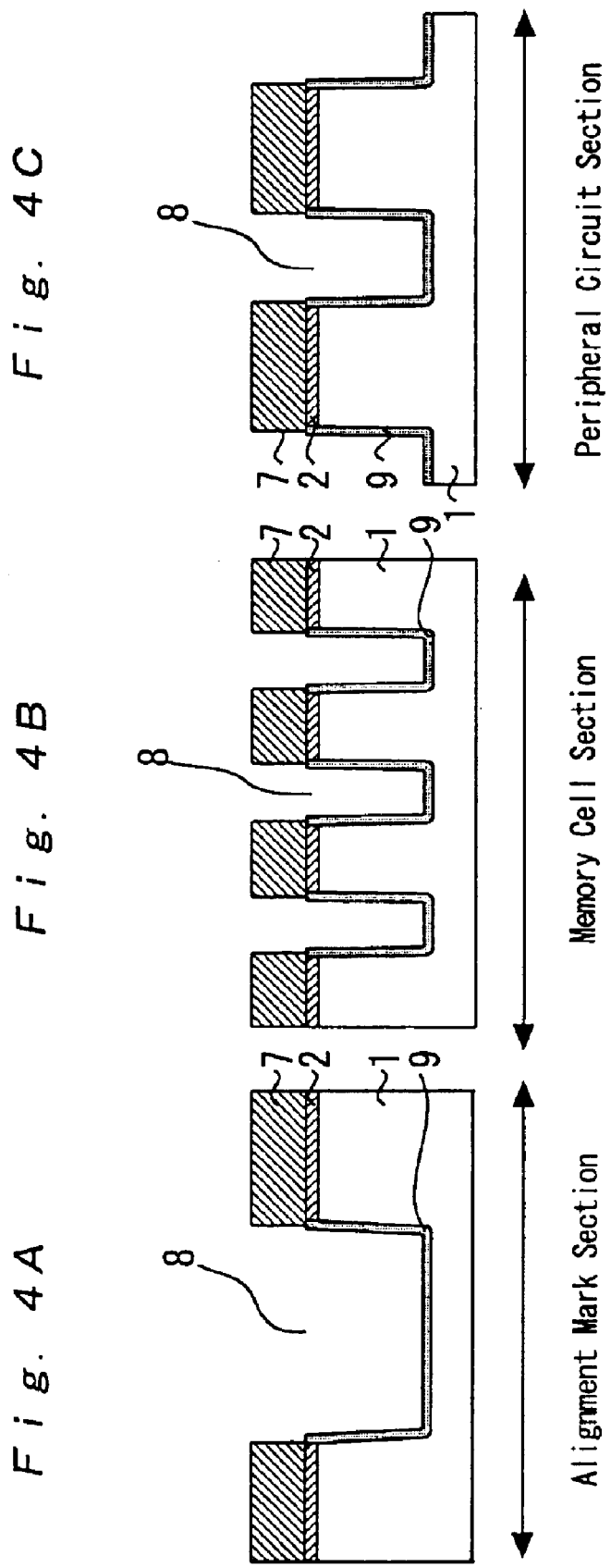

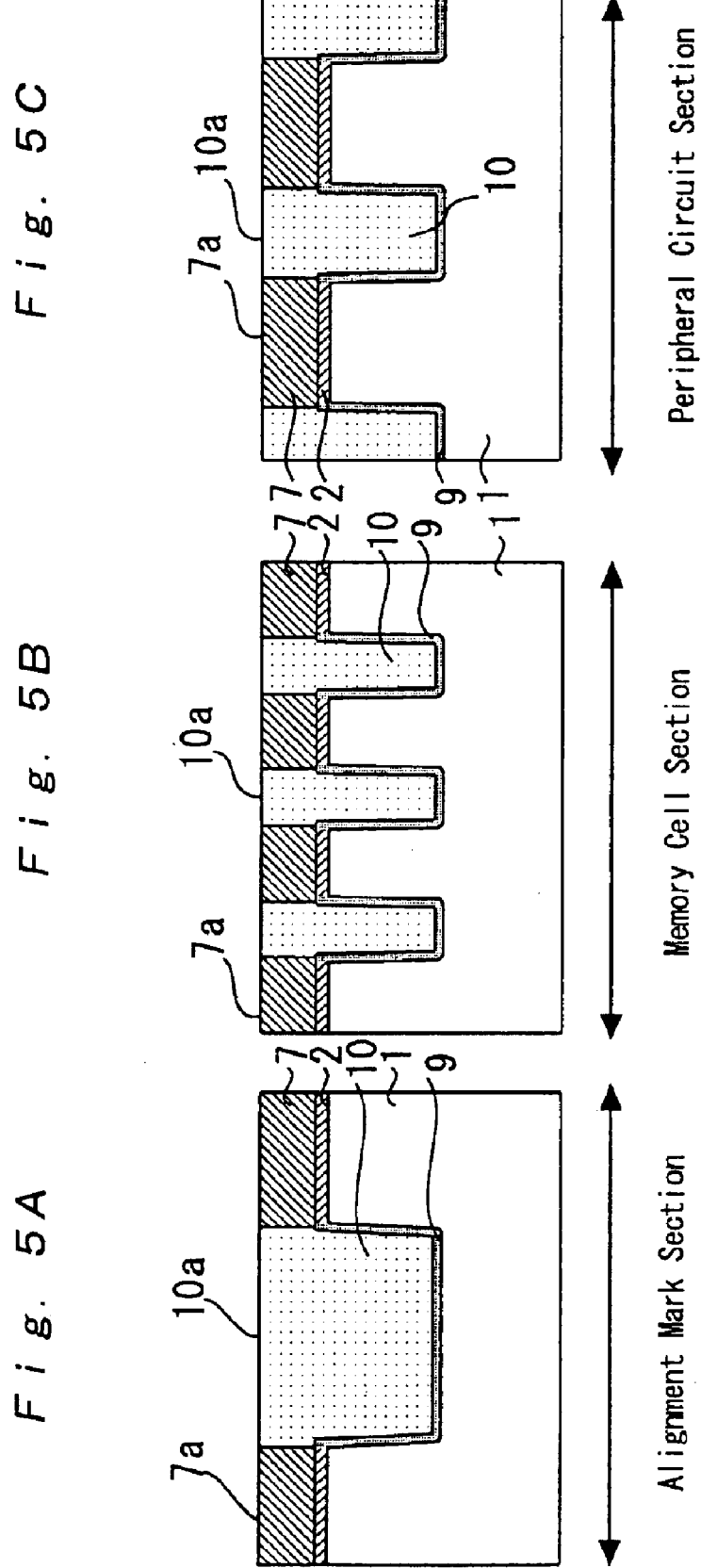

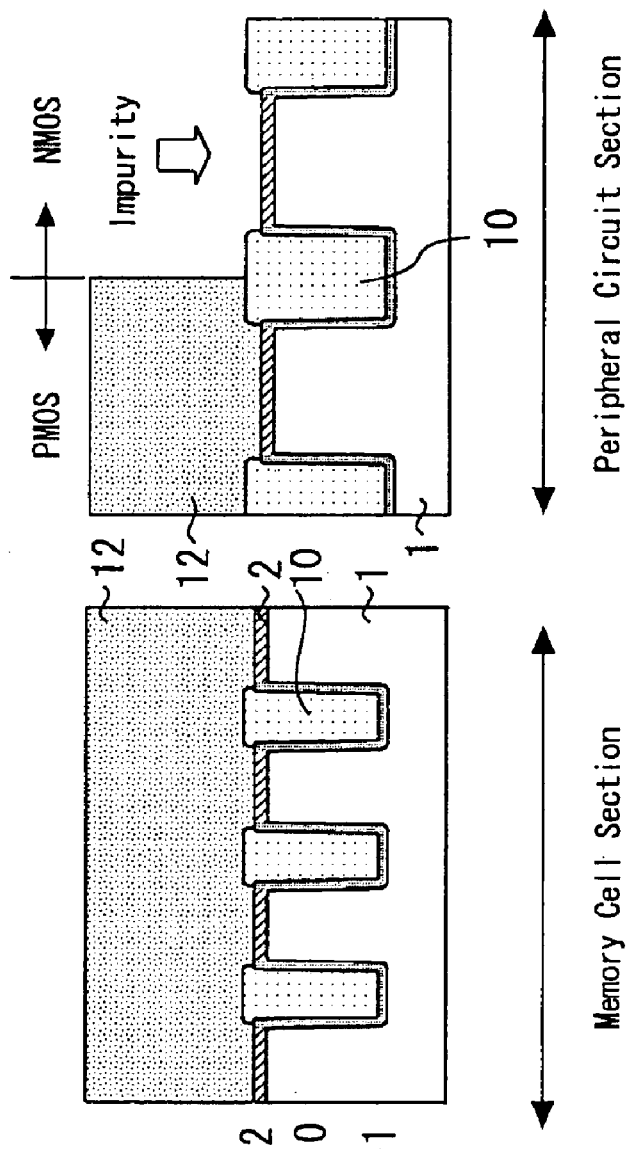

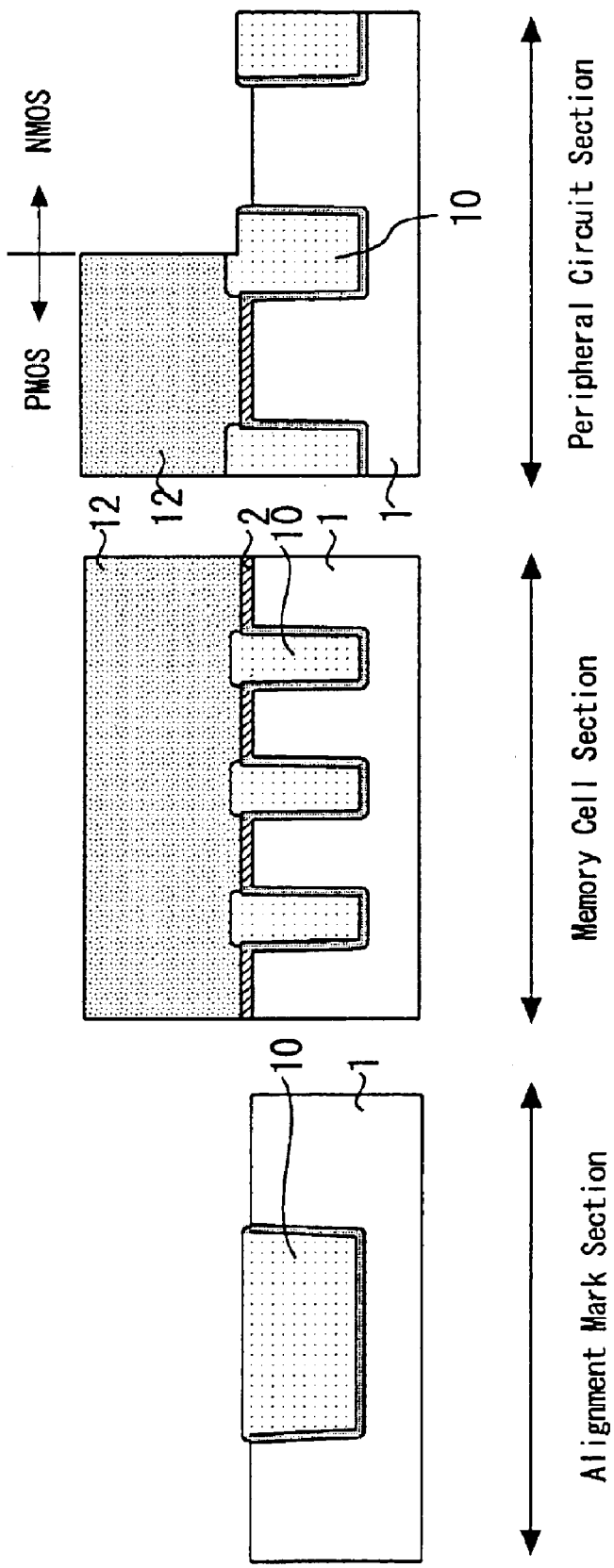

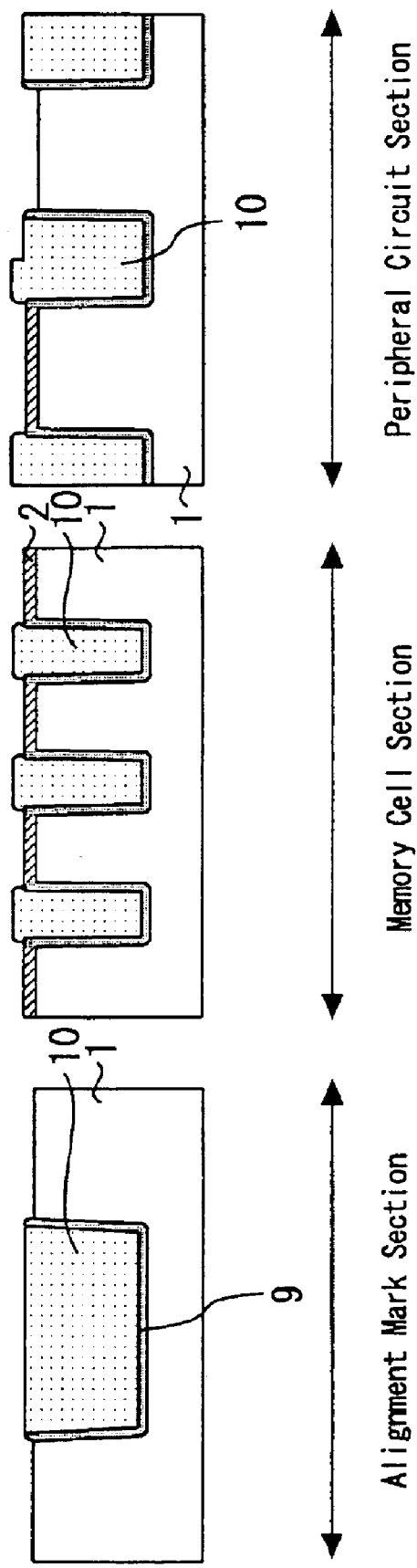

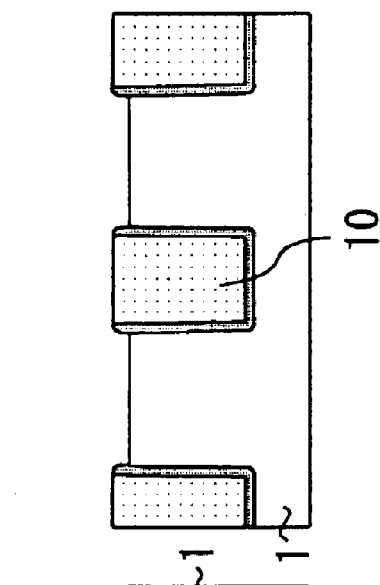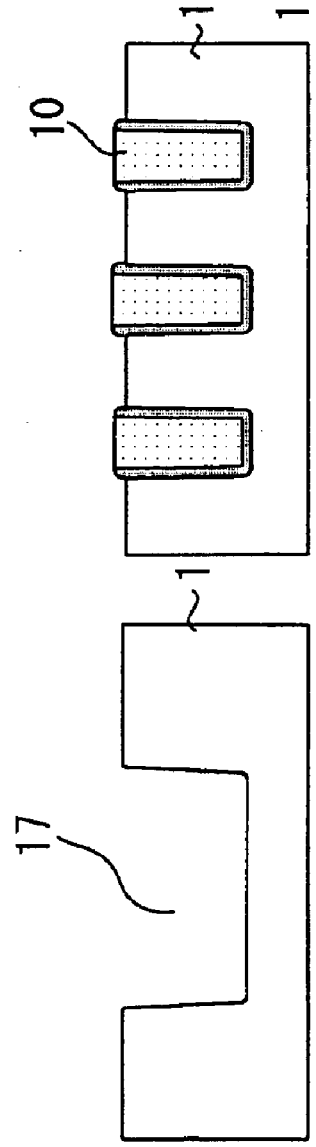

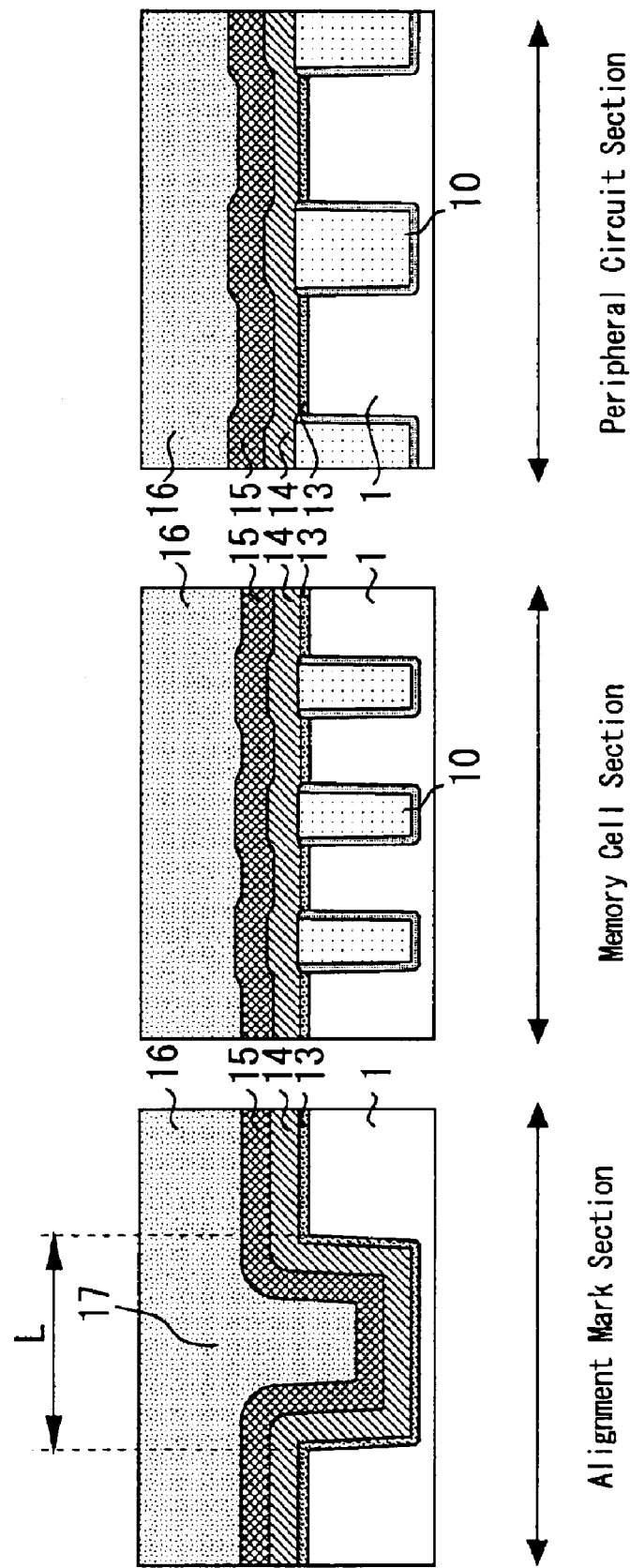

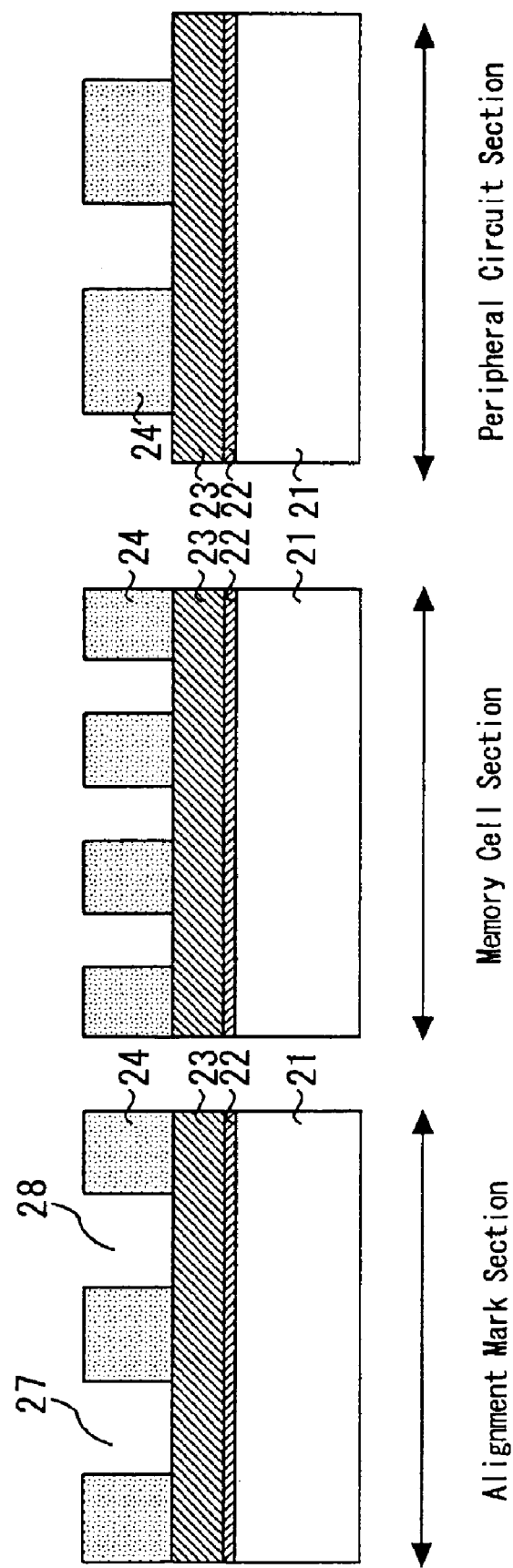

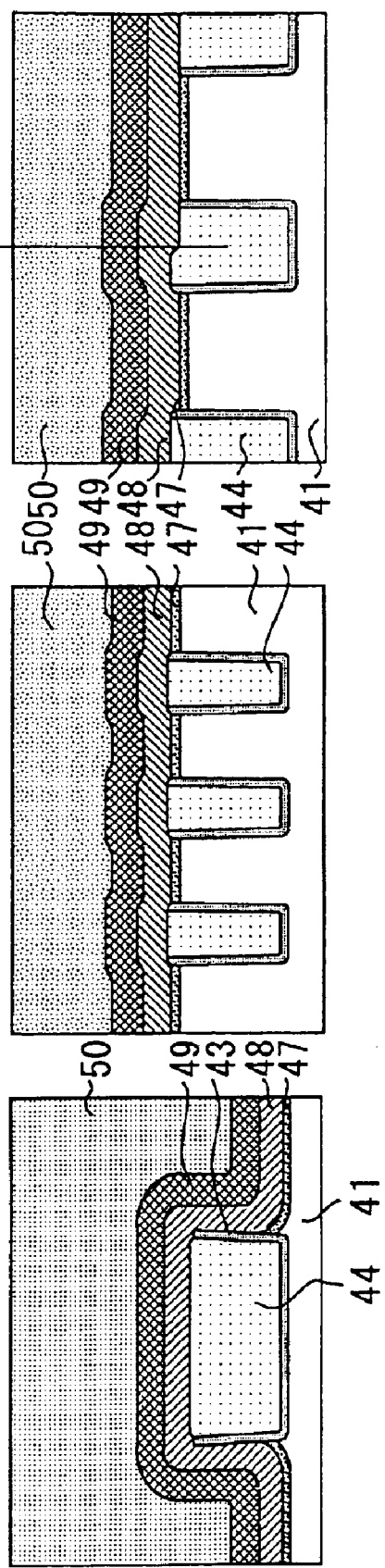

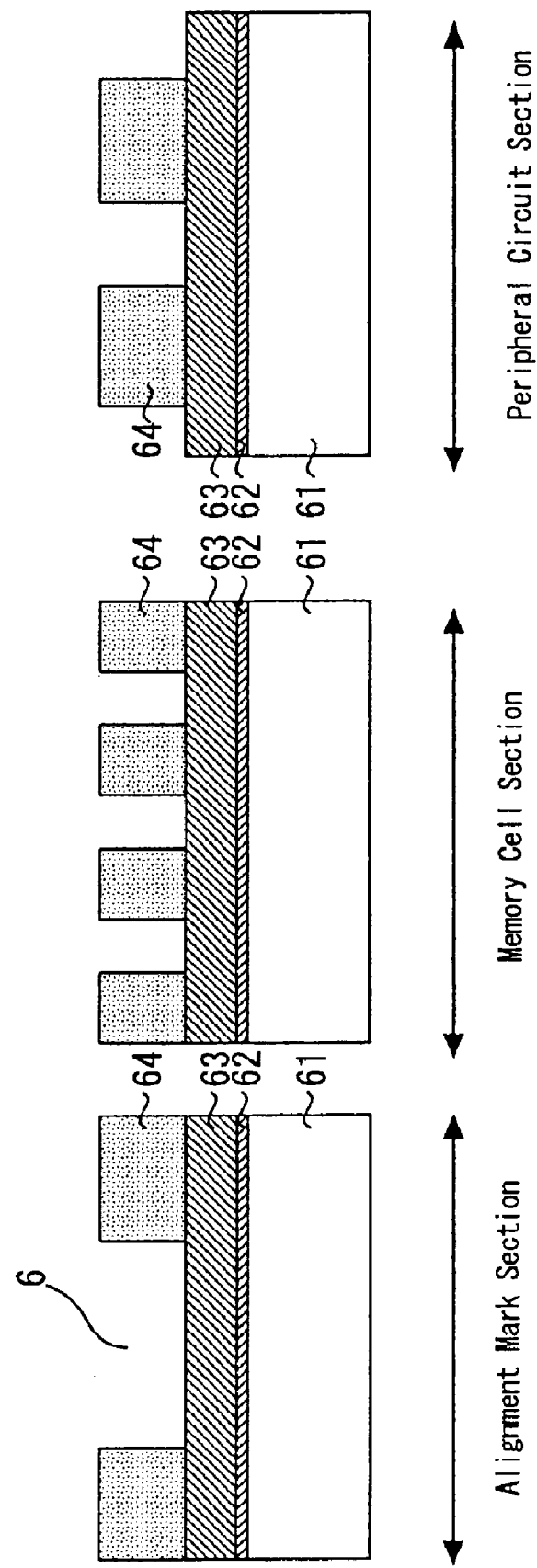

Alignment Mark Section | Memory Cell Section | Peripheral Circuit Section

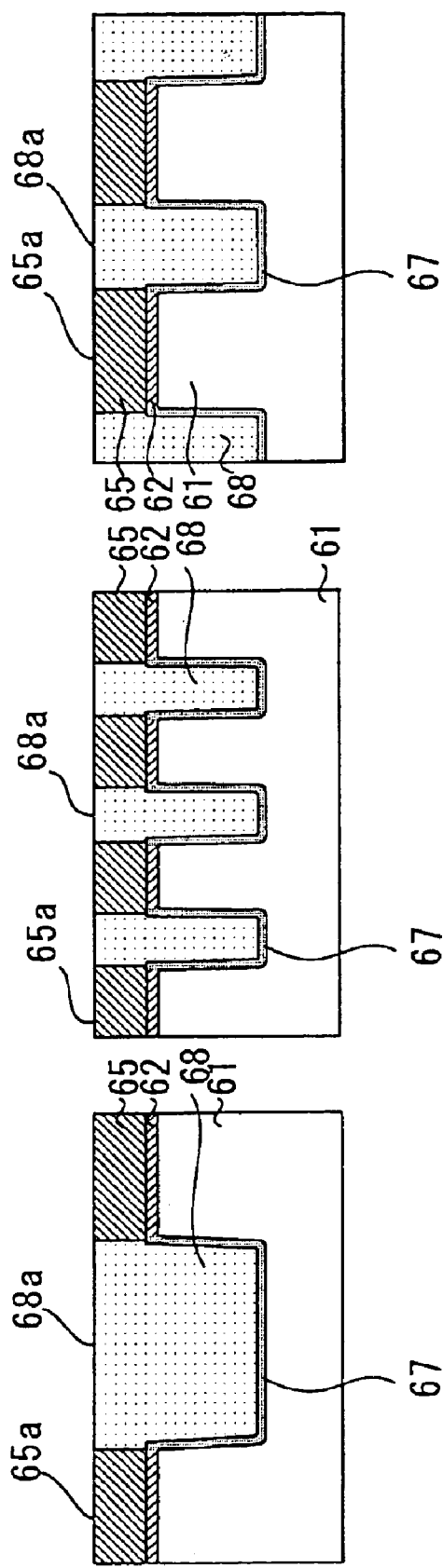
Fig. 30A Prior Art — Alignment Mark Section
Fig. 30B Prior Art — Memory Cell Section
Fig. 30C Prior Art — Peripheral Circuit Section

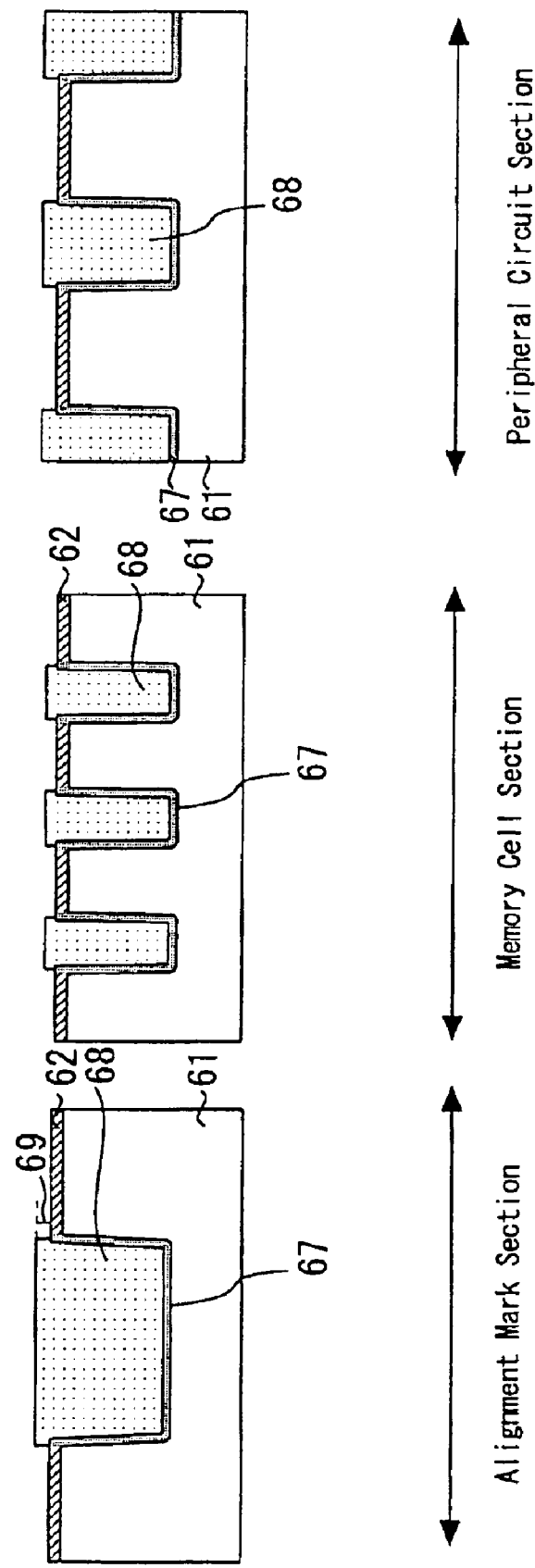

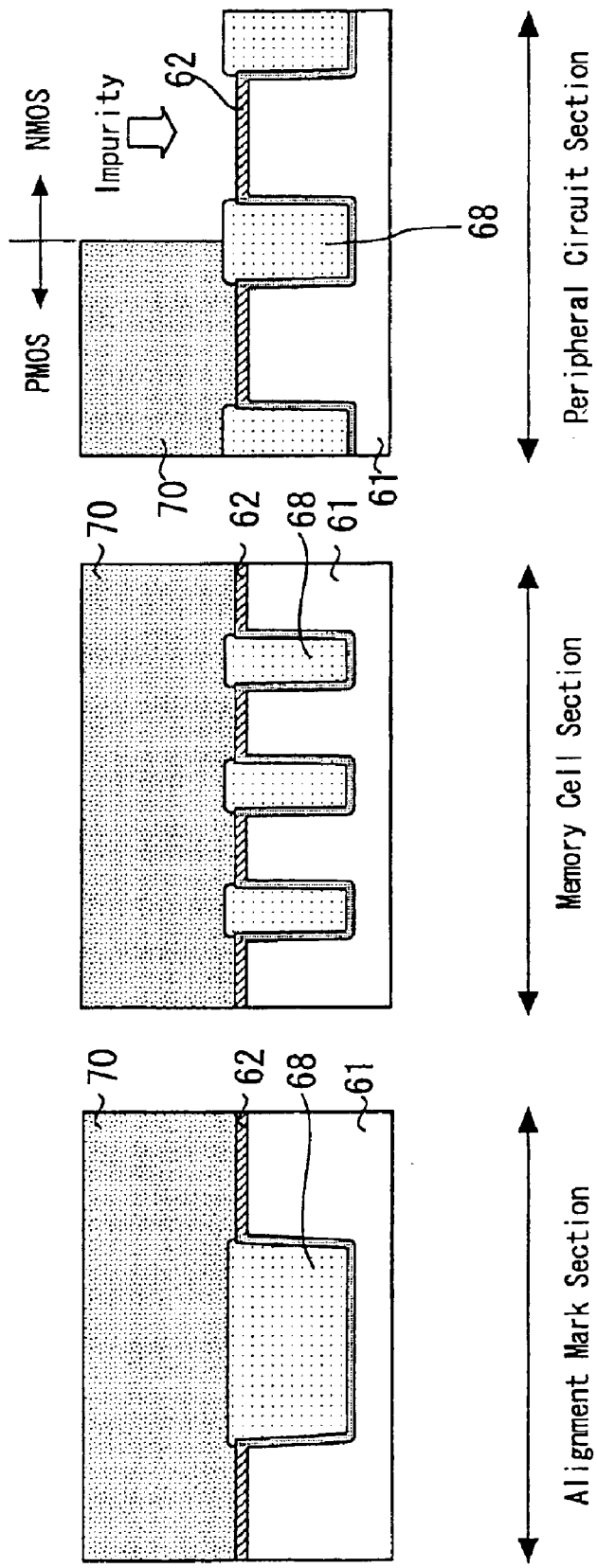
Fig. 32A Prior Art — Alignment Mark Section
Fig. 32B Prior Art — Memory Cell Section
Fig. 32C Prior Art — Peripheral Circuit Section

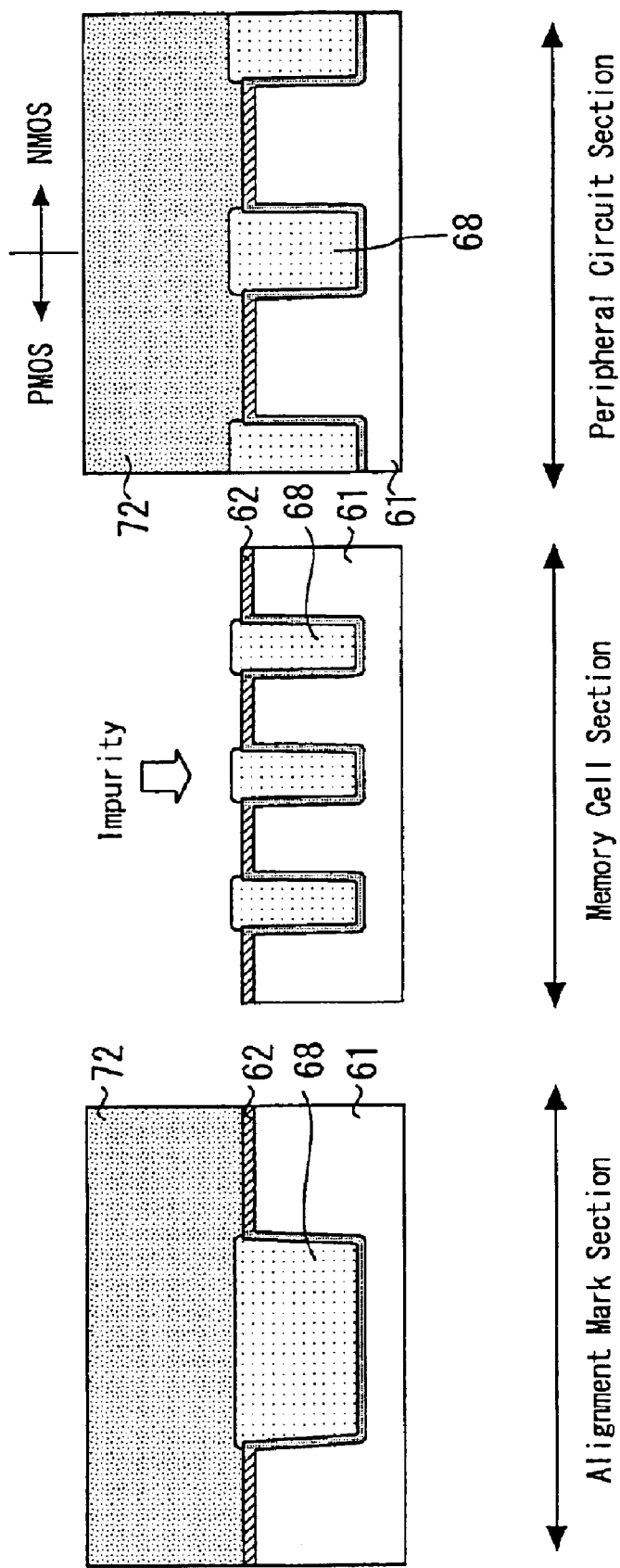

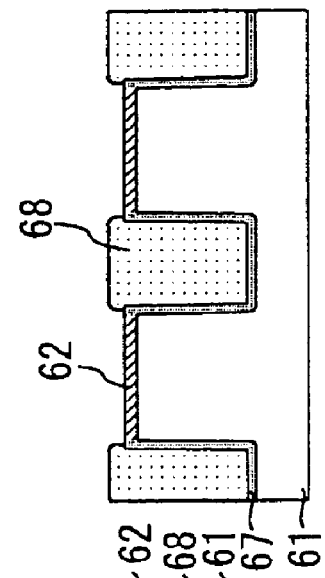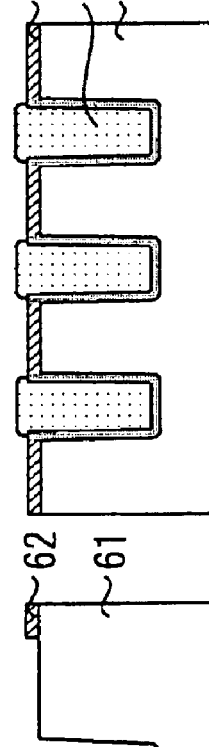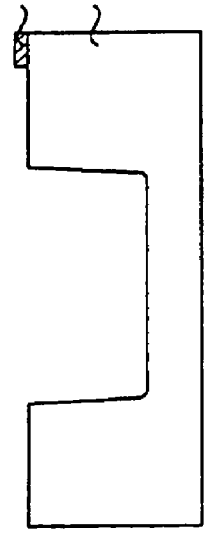
Fig. 36A Prior Art — Alignment Mark Section
Fig. 36B Prior Art — Memory Cell Section
Fig. 36C Prior Art — Peripheral Circuit Section

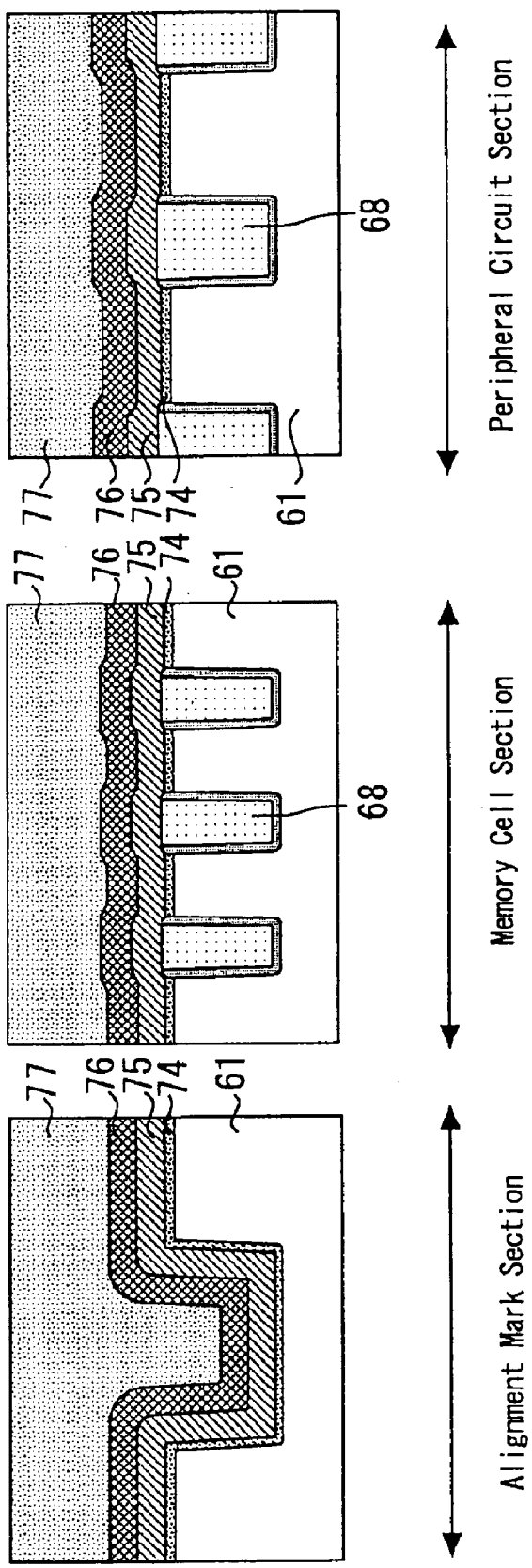

METHOD FOR MANUFACTURING SEMICONDUCTOR DEVICE

BACKGROUND OF THE INVENTION

1. Field of the Invention

The present invention relates to a method for manufacturing a semiconductor device, and more particularly to a method for manufacturing a semiconductor device having a device formation section (or region) and an alignment mark section on a semiconductor substrate.

2. Background Art

In recent years, semiconductor devices have become smaller and smaller as their integration density has increased and each semiconductor region of the devices has been miniaturized. The transistor characteristics of a miniaturized semiconductor device is significantly affected by the alignment between the active regions and the gate electrodes, as described in detail below.

Each gate electrode (of a semiconductor device) is formed on a predetermined area of an active region. Therefore, when the gate electrode material is patterned, it is necessary to carry out the process of aligning the gate electrode material with the active regions.

One method for such alignment is to detect the alignment marks under the gate electrode material by passing light through the material. However, general-purpose memories such as DRAMs (Dynamic Random Access Memories), SRAM (Static Random Access Memories), and flash memories use polycide or polymetal as their gate electrode material, which makes it difficult to detect the alignment marks since these materials have a high light reflectance level.

To overcome the above problem, a step (or a height difference) is formed in the alignment mark section to facilitate the alignment, as described in Japanese Laid-Open Patent Publication No. 11-87488 (1999).

Description will be made of a conventional method for manufacturing a semiconductor device with reference FIGS. 28 to 37. It should be noted that in these figures, like numerals will be used to denote like components.

First of all, a silicon oxide film 62 and a silicon nitride film 63 are sequentially formed on a semiconductor substrate 61, as shown in FIGS. 28A to 28C. Then, active region patterns are formed on the semiconductor substrate 61 by use of a photolithographic technique. Specifically, first a resist pattern 64 is formed on the silicon nitride film 63. It should be noted that FIG. 28A, 28B, and 28C show the portions of the resist pattern (64) in the alignment mark section, the memory cell section, and the peripheral circuit section, respectively.

Then, the silicon nitride film 63 is etched using the resist patterns 64 as a mask, forming a silicon nitride film pattern 65 as a hard mask. After removing the resist pattern 64, which is no longer necessary, the semiconductor substrate 61 is etched using the silicon nitride film pattern 65. Then, a silicon oxide film 67 is formed on the inside walls of grooves 66 by the thermal oxidation method, producing the structures shown in FIGS. 29A to 29C.

Then, a silicon oxide film 68 is formed on the silicon nitride film pattern 65 such that it fills the grooves 66, and polished by the CMP (Chemical Mechanical Polishing) method, producing the structures shown in FIGS. 30A to 30C. In these figures, the top surface 68a of the silicon oxide film 68 and the top surface 65a of the silicon nitride film pattern 65 are in the same plane.

After wet-etching the silicon oxide film 68 by use of hydrofluoric acid, the silicon nitride film pattern 65 is removed since it is no longer necessary. This produces the structures shown in FIGS. 31A to 31C. These figures show a step(s) 69 having a height of h' formed at the boundary between the silicon oxide film 68 and the silicon oxide film 62.

Then, channel doping is applied to the semiconductor substrate 61 to set the well for each transistor and the transistor threshold value. Specifically, impurities of a first or second conductive type are ion-implanted in desired areas using resist patterns formed by a photolithographic technique as masks.

For example, as shown in FIGS. 32A to 32C, a resist pattern 70 is formed on all sections except for the NMOS region of the peripheral circuit section (shown in FIG. 32C). Then, impurity ions are implanted in the NMOS region using the resist pattern 70 as a mask. After removing the resist pattern 70, which is no longer necessary, a resist pattern 71 is formed on all sections except for the PMOS region of the peripheral circuit section (shown in FIG. 33C), as shown in FIGS. 33A to 33C. Then, impurity ions are implanted in the PMOS region using the resist pattern 71 as a mask. After that, the resist pattern 71 is removed since it is no longer necessary. Then, as shown in FIGS. 34A to 34C, a resist pattern 72 is formed on all sections other than the memory cell section (shown in FIG. 34B). After implanting impurity ions in the memory cell section using the resist pattern 72 as a mask, the resist pattern 72 is removed since it is no longer necessary.

After the above ion implantation, a resist pattern 73 is formed on all sections other than the alignment mark section, as shown in FIGS. 35A to 35C. Then, the silicon oxide films 62, 67, and 68 are removed through wet-etching using the resist pattern 73 as a mask. After that, the resist pattern 73, which is no longer necessary, is removed, producing the structures shown in FIGS. 36A to 36C.

Furthermore, after removing the silicon oxide film 62 by wet-etching, a gate insulation film material 74, a gate electrode material 75, a hard mask material 76, and a resist film 77 are laminated in that order, producing the structures shown in FIGS. 37A to 37C.

In FIGS. 37B and 37C, the surface of the silicon oxide film 68 buried in the grooves in the memory cell section and the peripheral circuit section and the surface of the gate insulation film material 74 formed on the semiconductor substrate 61 together form a substantially flat surface even though there exist some small steps at the boundary between them. Therefore, the surfaces of the gate electrode material 75 and the hard mask material 76 formed on the above substantially flat surface are also substantially flat.

On the other hand, as shown in FIG. 37A, since the silicon oxide film 68 is not formed on the groove in the alignment mark section, the gate insulation film material 74, the gate electrode material 75, and the hard mask material 76 are formed along the groove, forming a concave portion. That is, formation of such a big step (concave portion) in the alignment mark portion facilitates detection of the alignment marks. Therefore, the resist film 77 can be patterned at a desired position, allowing the gate electrodes to be formed at desired positions.

The above conventional method, however, requires the process shown in FIGS. 35 and 36 to form a step in the alignment mark section. That is, after implanting ions in the peripheral circuit section and the memory cell section, a resist pattern having an opening over the alignment mark section must be formed, and then the silicon oxide films in the alignment mark section must be removed using the resist pattern as a mask. As a result, the total number of processes required greatly increases, leading to the problem of a reduction in the throughput, cost, yield, etc.

SUMMARY OF THE INVENTION

The present invention has been devised in view of the above problems. It is, therefore, an object of the present invention to provide a semiconductor device and a manufacturing method therefor capable of providing a reduced number of manufacturing processes required without reducing the alignment accuracy when the gate electrodes are formed.

Other objects and advantages of the present invention will become apparent from the following description.

According to one aspect of the present invention, in a method for manufacturing a semiconductor device, a first insulation film is formed on a semiconductor substrate of a first conductive type. A hard mask is formed on the first insulation film. The first insulation film and the semiconductor substrate are etched using the hard mask so as to form grooves having a predetermined depth in an alignment mark section and a device formation section of the semiconductor substrate. A second insulation film is buried into the grooves. The hard mask is removed. A resist pattern is formed on predetermined areas of the first and the insulation films. Impurities are ion-implanted in the semiconductor substrate using the resist pattern as a mask, the impurities being of at least one of first and second conductive types. The portion of the first insulation film exposed at (an opening of) the resist pattern, and the portion of the second insulation film corresponding to a film thickness of the first insulation film (and exposed at the opening of the resist pattern) are removed. The resist pattern is removed. A gate insulation film is formed on the semiconductor substrate. A gate electrode is formed on the gate insulation film. The resist pattern also has an opening over the alignment mark section. The series of steps from the resist pattern forming step to the resist pattern removing step are repeated to form a concave portion having a predetermined depth in the alignment mark section.

According to another aspect of the present invention, in a method for manufacturing a semiconductor device, a first insulation film is formed on a semiconductor substrate of a first conductive type. A hard mask is formed on the first insulation film. The first insulation film and the semiconductor substrate are etched using the hard mask so as to form a groove in a device formation section of the semiconductor substrate and to form a first groove and a second groove in an alignment mark section of the semiconductor substrate, the groove and the first and second grooves having substantially a same predetermined depth. A second insulation film is buried into all the grooves formed in the device formation section and the alignment mark section. The hard mask is removed. A first resist pattern having openings is formed over the alignment mark section and a predetermined area of the device formation section. Impurities are ion-implanted in the semiconductor substrate using the first resist pattern as a mask, the impurities being of at least one of first and second conductive types. The portion of the first insulation film exposed at the first resist pattern is removed so as to expose the semiconductor substrate. The first resist pattern is removed. A second resist pattern which covers the area (the predetermined area) of the device formation section at which the semiconductor substrate is exposed is formed, the second resist pattern having openings over another predetermined area of the device formation section and an area sandwiched by the first and second grooves in the alignment mark section. Impurities are ion-implanted in the semiconductor substrate using the second resist pattern as a mask, the impurities being of at least one of the first and second conductive types. The portion of the semiconductor substrate exposed at the second resist pattern is electively etched to form a concave portion having a predetermined depth in the alignment mark section. The second resist pattern is removed. A gate insulation film is formed on the semiconductor substrate. A gate electrode is formed on the gate insulation film.

According to other aspect of the present invention, in a method for manufacturing a semiconductor device, a first insulation film is formed on a semiconductor substrate of a first conductive type. A hard mask is formed on the first insulation film. The first insulation film and the semiconductor substrate are etched using the hard mask so as to form grooves having a predetermined depth in an alignment mark section and a device formation section of the semiconductor substrate. A second insulation film is buried into the grooves. The hard mask is removed. A first resist pattern having openings is formed over the alignment mark section and a predetermined area of the device formation section. Impurities are ion-implanted in the semiconductor substrate using the first resist pattern as a mask, the impurities being of at least one of first and second conductive types. The portion of the first insulation film exposed at the first resist pattern is removed so as to expose the semiconductor substrate. The first resist pattern is removed. A second resist pattern which covers the area (the predetermined area) of the device formation section at which the semiconductor substrate is exposed is formed, the second resist pattern having openings over the alignment mark section and another predetermined area of the device formation section. Impurities are ion-implanted in the semiconductor substrate using the second resist pattern as a mask, the impurities being of at least one of the first and second conductive types. The portion of the semiconductor substrate exposed at the second resist pattern is selectively etched to form a convex portion having a predetermined height in the alignment mark section. The second resist pattern is removed. A gate insulation film is formed on the semiconductor substrate. A gate electrode is formed on the gate insulation film.

Other and further objects, features and advantages of the invention will appear more fully from the following description.

BRIEF DESCRIPTION OF THE DRAWINGS

FIG. 3A is a cross-sectional view of the alignment mark section according to the first embodiment.

FIG. 3B is a cross-sectional view of the memory cell section according to the first embodiment.

FIG. 3C is a cross-sectional view of the peripheral circuit section according to the first embodiment.

FIG. 4A is a cross-sectional view of the alignment mark section according to the first embodiment.

FIG. 4B is a cross-sectional view of the memory cell section according to the first embodiment.

FIG. 4C is a cross-sectional view of the peripheral circuit section according to the first embodiment.

FIG. 5A is a cross-sectional view of the alignment mark section according to the first embodiment.

FIG. 5B is a cross-sectional view of the memory cell section according to the first embodiment.

FIG. 5C is a cross-sectional view of the peripheral circuit section according to the first embodiment.

FIG. 7A is a cross-sectional view of the alignment mark section according to the first embodiment.

FIG. 7B is a cross-sectional view of the memory cell section according to the first embodiment.

FIG. 7C is a cross-sectional view of the peripheral circuit section according to the first embodiment.

FIG. 8A is a cross-sectional view of the alignment mark section according to the first embodiment.

FIG. 8B is a cross-sectional view of the memory cell section according to the first embodiment.

FIG. 8C is a cross-sectional view of-the peripheral circuit section-according to the first embodiment.

FIG. 9A is a cross-sectional view of the alignment mark section according to the first embodiment.

FIG. 9B is a cross-sectional view of the memory cell section according to the first embodiment.

FIG. 9C is a cross-sectional view of the peripheral circuit section according to the first embodiment.

FIG. 10A is a cross-sectional view of the alignment mark section according to the first embodiment.

FIG. 10B is a cross-sectional view of the memory cell section according to the first embodiment.

FIG. 10C is a cross-sectional view of the peripheral circuit section according to the first embodiment.

FIG. 11A is a cross-sectional view of the alignment mark section according to the first embodiment.

FIG. 11B is a cross-sectional view of the memory cell section according to the first embodiment.

FIG. 11C is a cross-sectional view of the peripheral circuit section according to the first embodiment.

FIG. 12A is a cross-sectional view of the alignment mark section according to the first embodiment.

FIG. 12B is a cross-sectional view of the memory cell section according to the first embodiment.

FIG. 12C is a cross-sectional view of the peripheral circuit section according to the first embodiment.

FIG. 27A is a cross-sectional view of the alignment mark section according to the third embodiment.

FIG. 27B is a cross-sectional view of the memory cell section according to the third embodiment.

FIG. 27C is a cross-sectional view of the peripheral circuit section according to the third embodiment.

FIG. 28A is a cross-sectional view of the conventional alignment mark section.

FIG. 28B is a cross-sectional view of the conventional memory cell section.

FIG. 28C is a cross-sectional view of the conventional peripheral circuit section.

FIG. 30A is a cross-sectional view of the conventional alignment mark section.

FIG. 30B is a cross-sectional view of the conventional memory cell section.

FIG. 30C is a cross-sectional view of the conventional peripheral circuit section.

FIG. 31A is a cross-sectional view of the conventional alignment mark section.

FIG. 31B is a cross-sectional view of the conventional memory cell section.

FIG. 31C is a cross-sectional view of the conventional peripheral circuit section.

FIG. 32A is a cross-sectional view of the conventional alignment mark section.

FIG. 32B is a cross-sectional view of the conventional memory cell section.

FIG. 32C is a cross-sectional view of the conventional peripheral circuit section.

FIG. 34A is a cross-sectional view of the conventional alignment mark section.

FIG. 34B is a cross-sectional view of the conventional memory cell section.

FIG. 34C is a cross-sectional view of the conventional peripheral circuit section.

FIG. 36A is a cross-sectional view of the conventional alignment mark section.

FIG. 36B is a cross-sectional view of the conventional memory cell section.

FIG. 36C is a cross-sectional view of the conventional peripheral circuit section.

FIG. 37A is a cross-sectional view of the conventional alignment mark section.

FIG. 37B is a cross-sectional view of the conventional memory cell section.

FIG. 37C is a cross-sectional view of the conventional peripheral circuit section.

DETAILED DESCRIPTION OF THE PREFERRED EMBODIMENTS

First Embodiment

Figure 1:
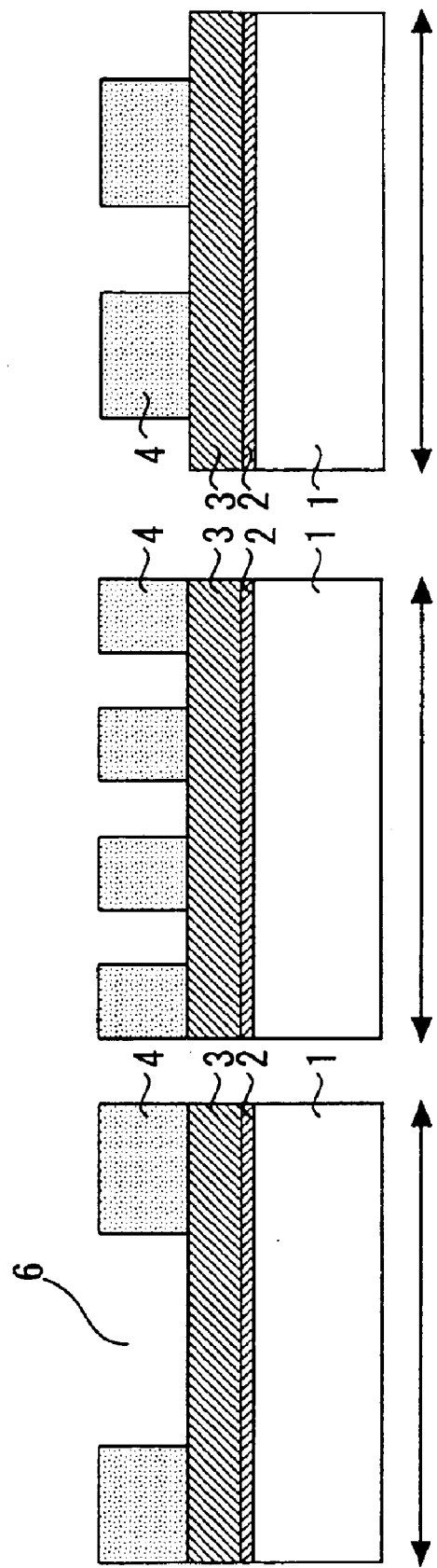
FIG. 1A is a cross-sectional view of the alignment mark section according to the first embodiment.
FIG. 1B is a cross-sectional view of the memory cell section according to the first embodiment.
FIG. 1C is a cross-sectional view of the peripheral circuit section according to the first embodiment.

Description will be made of a method for manufacturing a semiconductor device according to a first embodiment of the present invention with reference to FIGS. 1 to 11. It should be noted that in these figures, like numerals will be used to denote like components.

As shown in FIGS. 1A to 1C, first a silicon oxide film 2 is formed on a semiconductor substrate 1 of a first conductive type as a first insulation film. Then, a silicon nitride film 3 is formed on the silicon oxide film 2. The silicon nitride film 3 is used to form a hard mask.

A silicon substrate may be used as the semiconductor substrate 1. Further, the silicon oxide film 2 may be formed by the thermal oxidation method such that it has a film thickness of approximately 20 nm. Still further, the silicon nitride film 3 may be formed by the CVD (Chemical Vapor Deposition) method such that it has a film thickness of approximately 100 nm.

Then, active region patterns are formed on the semiconductor substrate 1 by use of a photolithographic technique. Specifically, first a resist pattern 4 is formed on the silicon nitride film 3. FIGS. 1A, 1B, and 1C show the portions of the resist pattern (4) in the alignment mark section, the memory cell section, and the peripheral circuit section, respectively. It should be noted that the memory cell section and the peripheral circuit section are hereinafter collectively referred to as the device formation section.

Figure 2:
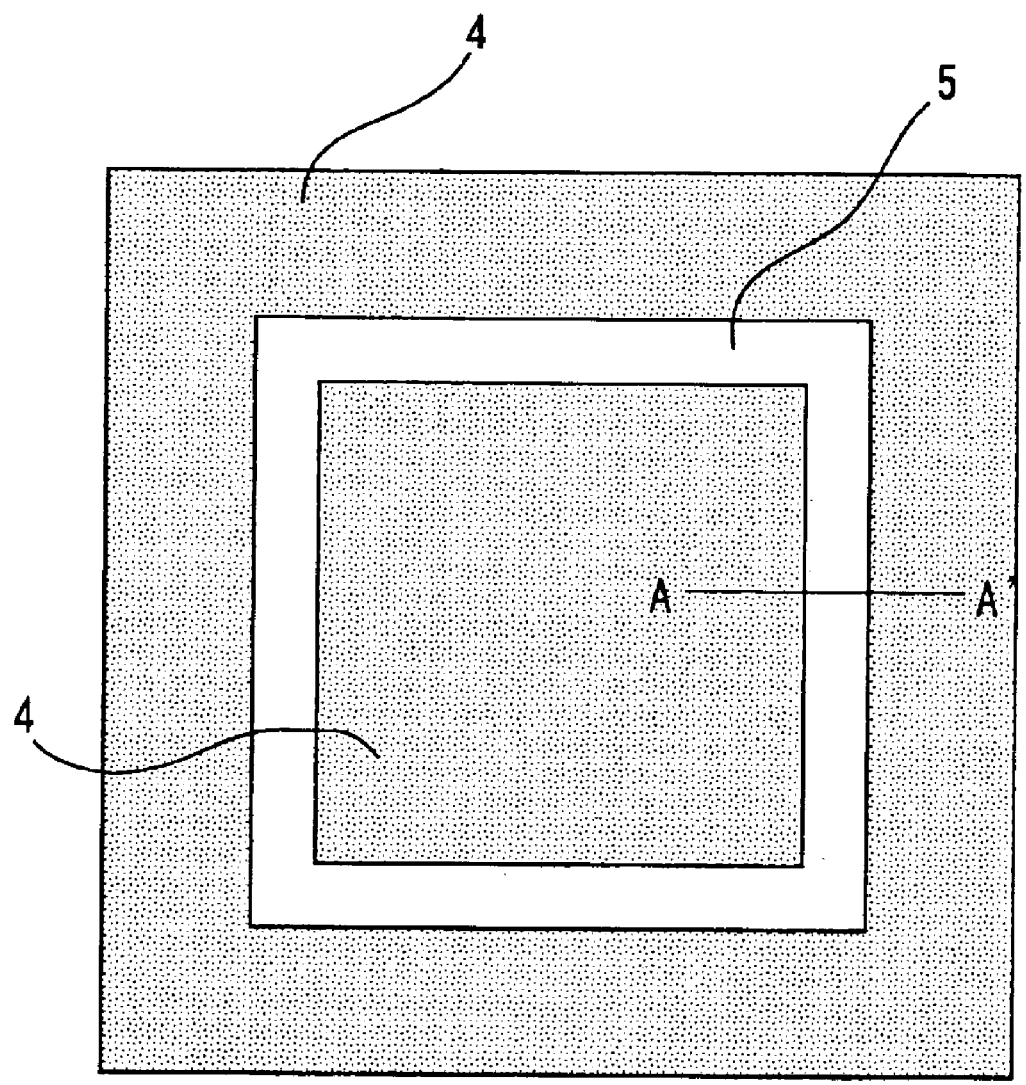
FIG. 2 is a plan view of the alignment mark section according to the first embodiment.

FIG. 2 is a plan view of the alignment mark section. In the figure, a rectangular pattern 5 indicates the alignment mark. That is, FIG. 1A is a cross-sectional view of the alignment mark section in FIG. 2 taken along line A–A', and the rectangular pattern 5 in FIG. 2 corresponds to a groove 6 in FIG. 1A.

Then, the silicon nitride film 3 is etched using the resist pattern 4 as a mask. After that, the resist pattern 4 is removed, producing the structures shown in FIGS. 3A to 3C. A silicon nitride film pattern 7 in these figures is used as a hard mask in the next process. It should be noted that FIGS. 3A, 3B, and 3C show the portions of the silicon nitride film pattern 7 in the alignment mark section, the memory cell section, and the peripheral circuit section, respectively.

Then, the silicon-oxide film 2 and the semiconductor substrate 1 are etched using the silicon nitride film pattern 7 as a mask, forming grooves 8 as shown in FIG. 4A to 4C. At that time, the etch depth may be set to approximately 300 nm, considering the withstand voltage for the separation. After that, a silicon oxide film 9 is formed on the inside walls of the grooves 8 by the thermal oxidation method, etc. The film thickness of the silicon oxide film 9 may be set to approximately 25 nm. It should be noted that FIGS. 4A, 4B, and 4C show the grooves 8 in the alignment mark section, the memory cell section, and the peripheral circuit section, respectively.

Then, a silicon oxide film 10 is formed on the silicon nitride film pattern 7 as a second insulation film such that it fills the grooves 8. The silicon oxide film 10 may be formed by the CVD method, the SOG (Spin on Glass) method, etc. The silicon oxide film 10 is then polished by the CMP (Chemical Mechanical Polishing) method, producing the structures shown in FIGS. 5A to 5C. It should be noted that FIGS. 5A, 5B, and 5C show the portions of the silicon oxide film (10) in the alignment mark section, the memory cell section, and the peripheral circuit section, respectively. In these figures, the top surface 10a of the silicon oxide film 10 and the top surface 7a of the silicon nitride film pattern 7 are in substantially the same plane.

Figure 6A:
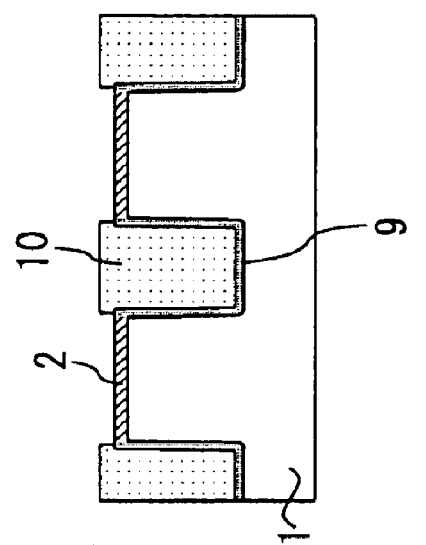
FIG. 6A is a cross-sectional view of the alignment mark section according to the first embodiment.
Figure 6B:
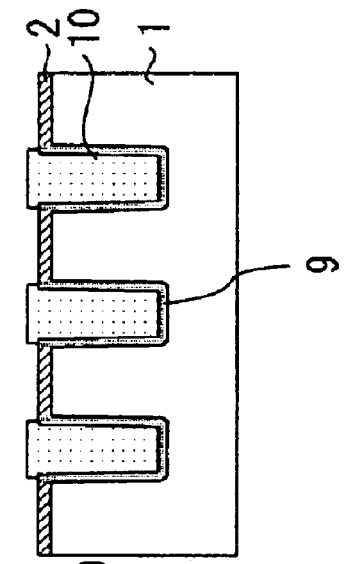
FIG. 6B is a cross-sectional view of the memory cell section according to the first embodiment.
Figure 6C:
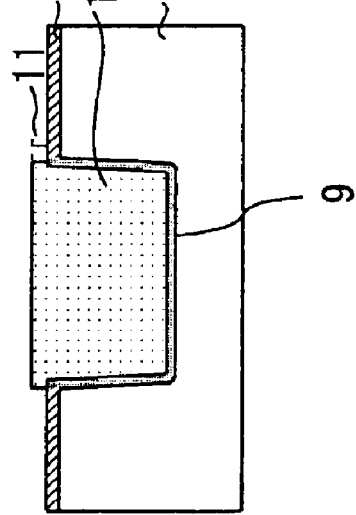
FIG. 6C is a cross-sectional view of the peripheral circuit section according to the first embodiment.

Then, the silicon oxide film 10 is wet-etched by use of hydrofluoric acid, etc. At that time, the silicon oxide film 10 is preferably selectively etched until the height of its top surface 10a from the bottom surface of the silicon nitride film pattern 7 is reduced to a predetermined value. For example, the etching of the silicon oxide film 10 is stopped when the distance from the bottom surface of the silicon nitride film pattern 7 to the top surface 10a of the silicon oxide film 10 is reduced to approximately between 10 nm and 20 nm. After that, the silicon nitride film pattern 7, which is no longer necessary, is removed through wet-etching by use of phosphoric acid, producing the structures shown in FIGS. 6A to 6C. It should be noted that FIGS. 6A, 6B, and 6C show the alignment mark section, the memory cell section, and the peripheral circuit section, respectively. These figures show a step 11 having a height of h1 formed at the boundary between the silicon oxide film 10 and the silicon oxide film 2. It should be noted that if the step 11 is formed by adjusting the film thickness of the silicon nitride film pattern 7, the above wet-etching process of the silicon oxide film 10 is not required.

Then, channel doping is applied to the semiconductor substrate 1 to set the well for each transistor and the transistor threshold value. Specifically, impurities of at least one of first and second conductive types are ion-implanted in desired areas using resist patterns formed by a photolithographic technique as masks.

According to the present embodiment, it is arranged that no resist pattern is formed also on the alignment mark section in the above process.

For example, description will be made of the process of implanting ions in the NMOS region of the peripheral circuit section with reference to FIGS. 7A to 7C. In this case, to implant ions in the NMOS region, a resist pattern 12 is not formed on the region, as shown in FIG. 7C. On the other hand, as shown in FIG. 7B, the resist pattern 12 is formed on the memory cell section since ions should not be implanted in this section. As for the alignment mark section, as shown in FIG. 7A, the present embodiment does not form the resist pattern 12 on it even though ions need not be implanted therein.

Specifically, the resist pattern may be formed as follows. When a positive type resist is used, a mask is prepared which has a conventional mask pattern and furthermore an opening for letting light pass through to the alignment mark section. Then, the resist film is irradiated with light through the mask and developed, making it possible to form a resist pattern having openings over both the target implantation area and the alignment mark section.

Then, impurity ions are implanted in the NMOS region using the resist pattern 12 as a mask, as shown in FIG. 7C. At that time, the impurity ions are also implanted in the alignment mark section, as shown in FIG. 7A. However, no problem arises since they do not affect the transistor characteristics.

After implanting the ions, the portions of the silicon oxide films 2, 9, and 10 exposed at the openings of the resist pattern 12 are wet-etched by use of hydrofluoric acid, etc. before the resist pattern 12 is removed. Specifically, the etching is stopped when the exposed portion of the silicon oxide film 2 has been removed, as shown in FIGS. 8A to 8C. After that, the resist pattern 12 is removed since it is no longer necessary, producing the structures shown in FIGS. 9A to 9C. It should be noted that FIGS. 9A, 9B, and 9C show the alignment mark section, the memory cell section, and the peripheral circuit section, respectively. These figures (FIGS. 9A and 9C) show that the portion of the silicon oxide film 2 not covered with the resist pattern 12 has been removed, along with the portions of the silicon oxide films 9 and 10 corresponding to the film thickness of the silicon oxide film 2.

Likewise, when ions are implanted in the PMOS region of the peripheral circuit section or in the memory cell section, a resist pattern is formed on the alignment mark section as well as the target implantation area.

After implanting the ions, the portions of the silicon oxide films 2, 9, and 10 exposed at the openings of the resist pattern are wet-etched before the resist pattern is removed. Specifically, the etching is stopped when the exposed portion of the silicon oxide film 2 (formed on the semiconductor substrate 1) has been removed. At that time, the portions of the silicon oxide films 9 and 10 corresponding to the film thickness of the silicon oxide film 2 are also removed. Thus, a number of etching operations corresponding to the number of ion implantation operations (that is, the number of transistors) are performed on the alignment mark section.

According to the present embodiment, also in each target implantation area, the silicon oxide film 2 and the portions of the silicon oxide films 9 and 10 corresponding to the film thickness of the silicon oxide film 2 are removed at the same time (for example, see FIG. 9C). However, even after the portion of the silicon oxide film 10 corresponding to the film thickness, of the silicon oxide film 2 has been removed, the surface of the silicon oxide film 10 is still higher than that of the semiconductor substrate 1 by h1 since there exists the step 11 having a height of h1 formed at the boundary between the surfaces of the silicon oxide film 2 and the silicon oxide film 10, as shown in FIG. 6. When the silicon oxide film 10 is removed by etching in a postprocess, this arrangement prevents the grooves 8 from being processed such that they have an inverse tapered shape in cross-section, thereby preventing deterioration of the electrical characteristics of the transistors.

It should be noted that the height of the step provided at the boundary between the surfaces of the silicon oxide film 10 and the semiconductor substrate 1 need not necessarily be equal to that of the step at the boundary between the surfaces of the silicon oxide film 10 and the silicon oxide film 2 (h1). That is, the same effect can be obtained if the surface of the silicon oxide film 10 has a height equal to or more than that of the surface of the semiconductor substrate 1.

Repeating ion implantation and wet-etching as described above gradually etches the silicon oxide films 9 and 10 buried in the groove 8 in the alignment mark section. As a result, a concave portion 17 having a predetermined depth is produced in the alignment mark section. FIGS. 10A, 10B, and 10C illustrate this process, respectively showing the alignment mark section, the memory cell section, and the peripheral circuit section.

It should be noted that the entire silicon oxide films 9 and 10 in the alignment mark section may not necessarily be etched, as with the case shown in FIG. 10A. However, if the depth of the concave portion 17 (that is, the height of the step at the boundary between the surface of the silicon oxide film 9 or 10 and that of the semiconductor substrate 1) is 50 nm or more, the alignment mark can be adequately detected. It should be noted that the number of transistors generally formed in the above process is large enough to form a concave portion 17 having a depth of 50 nm or more.

Therefore, the present embodiment can eliminate the conventional process of forming a mask for etching only the alignment mark section by a photolithographic technique, making it possible to reduce the cost and the number of processes for manufacturing the semiconductor device.

After implanting ions in all predetermined areas and then removing the silicon oxide films in the alignment mark section, a gate insulation film material 13, a gate electrode material 14, a hard mask material 15, and a resist film 16 are laminated in that order, producing the structures shown in FIGS. 11A to 11C. It should be noted that FIGS. 11A, 11B, and 11C show the alignment mark section, the memory cell section, and the peripheral circuit section, respectively. After patterning the resist film 16 by use of a photolithographic technique, the hard mask material 15 is etched using the patterned resist film 16 as a mask, forming a hard mask. After that, the gate electrode material 14 and the gate insulation film material 13 are etched using the hard mask, forming the gate insulation films and the gate electrodes.

It should be noted that after forming the hard mask material 15, an antireflective film may be formed thereon. When the resist film formed on the antireflective film is patterned, the antireflective film absorbs the exposure light which has passed through the resist film, functioning to eliminate the reflection of the exposure light at the interface between the resist film and the antireflective film. A film mainly made of an organic substance and formed by the spin coat method, etc. may be used as the antireflective film.

As can be seen from FIG. 11A, the width L of the concave portion 17 formed in the alignment mark section must satisfy formula (1) below.

$$L > (\text{film thickness of gate insulation film material} + \text{film thickness of gate electrode material} + \text{film thickness of hard mask material}) \times 2 \quad (1)$$

According to the present embodiment described above, each resist pattern used for ion implantation is provided with openings over the alignment mark section as well as a target implantation area. With this arrangement, after the implantation, the silicon oxide films exposed at the openings of the resist pattern are removed before removing the resist pattern. This process is repeated, thereby gradually removing the (entire) silicon oxide films in the alignment mark section. As a result, a step having a height of 50 nm or more can be eventually formed. Thus, it is possible to eliminate the photolithographic process for etching only the alignment mark section and thereby reduce the cost and the number of processes for manufacturing the semiconductor device.

Second Embodiment

Description will be made of a method for manufacturing a semiconductor device according to a second embodiment of the present invention with reference to FIGS. 12 to 21. It should be noted that in these figures, like numerals will be used to denote like components.

First of all, as in the first embodiment, a silicon oxide film 22 is formed on a semiconductor substrate 21 of a first conductive type as a first insulation film. Then, a silicon nitride film 23 is formed on the silicon oxide film 22. The silicon nitride film 23 is used to form a hard mask. A silicon substrate may be used as the semiconductor substrate 21.

Then, active region patterns are formed on the semiconductor substrate 21 by use of a photolithographic technique. Specifically, first a resist pattern 24 is formed on the silicon nitride film 23, producing the structures shown in FIGS. 12A to 12C. It should be noted that FIGS. 12A, 12B, and 12C show the portions of the resist pattern (24) in the alignment mark section, the memory cell section, and the peripheral circuit section, respectively.

Figure 13:
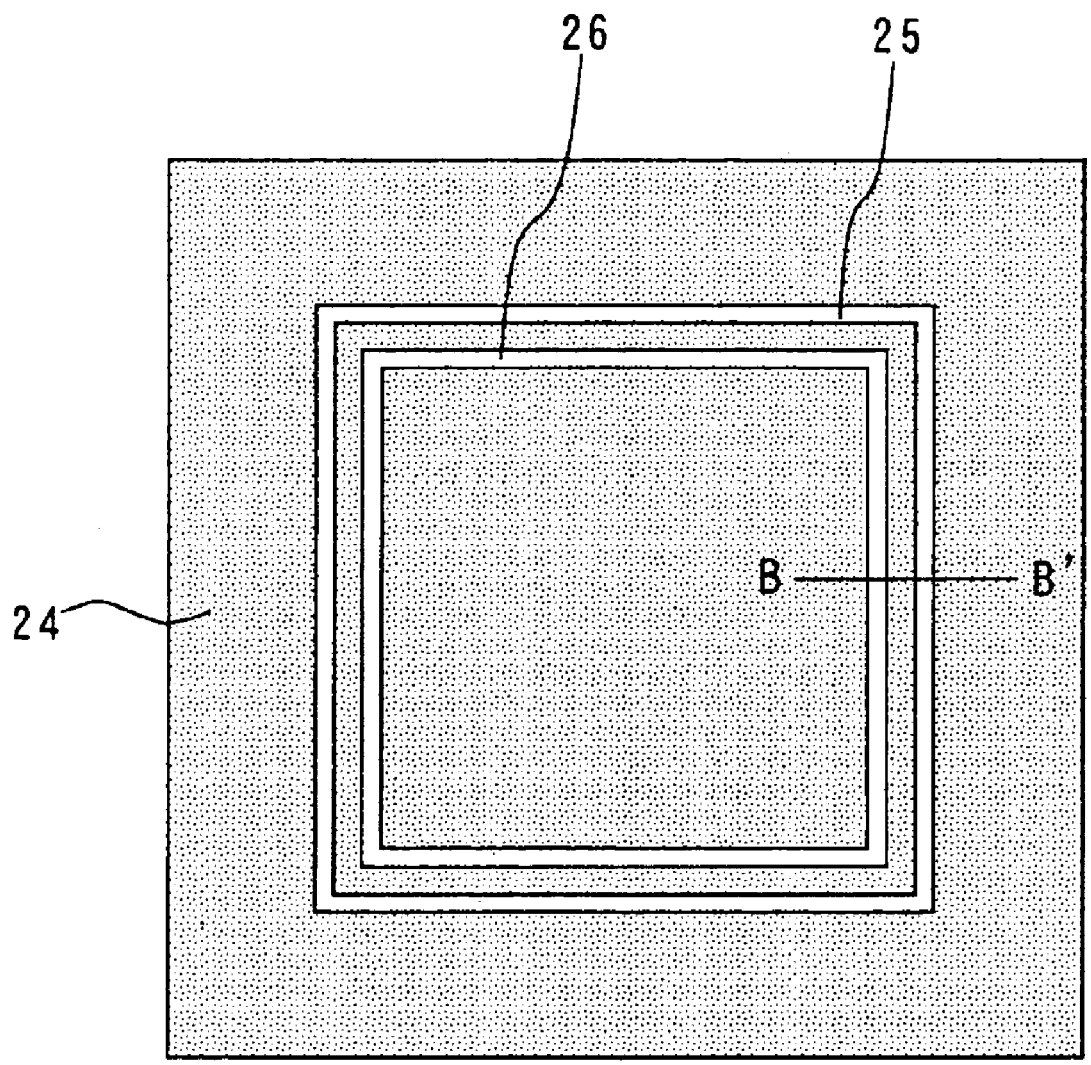
FIG. 13 is a plan view of the alignment mark section according to the second embodiment.

FIG. 13 is a plan view of the alignment mark section. As shown in the figure, the alignment mark of the present embodiment is made up of two rectangular patterns: a first rectangular pattern 25 and a second rectangular pattern 26 formed inside the first rectangular pattern 25. FIG. 12A is a cross-sectional view of the alignment mark section in FIG. 13 taken along line B–B'. The first rectangular pattern 25 and the second rectangular pattern 26 correspond to grooves 28 and 27 in FIG. 12A, respectively.

Then, the silicon nitride film 23 is etched using the resist pattern 24 as a mask, forming a hard mask (not shown). Then, the silicon oxide film 22 and the semiconductor substrate 21 are etched using the hard mask, forming a plurality of grooves having substantially the same depth in the device formation section and the alignment mark section. According to the present embodiment, first and second grooves corresponding to the grooves 27 and 28 shown in FIG. 12A are formed in the alignment mark section.

Then, a silicon oxide film 29 is formed on the inside walls of all formed grooves by the thermal oxidation method, etc. After that, as in the first embodiment, a silicon oxide film 30 is formed as a second insulation film such that it fills the above grooves. Then, the hard mask is removed, producing the structures shown in FIGS. 14A to 14C. It should be noted that FIGS. 14A, 14B, and 14C show the alignment mark section, the memory cell section, and the peripheral circuit section, respectively. These figures show a step 31 having a height of h2 formed at the boundary between the silicon oxide film 30 and the silicon oxide film 22. The step 31 may be formed in the same manner as in the first embodiment. For example, after burying the silicon oxide film 30 into the grooves, the silicon oxide film 30 may be selectively etched until the height of its top surface from the bottom surface of the hard mask is reduced to a predetermined value (between 10 nm and 20 nm). After that, the hard mask may be removed since it is no longer necessary.

Then, channel doping is applied to the semiconductor substrate 21 to set the well for each transistor and the transistor threshold value. Specifically, impurities of at least one of first and second conductive types are ion-implanted in desired areas using resist patterns formed by a photolithographic technique as masks. At that time, it is arranged that no resist pattern is formed also on the alignment mark section, as in the first embodiment.

For example, description will be made of the process of implanting ions in the NMOS region of the peripheral circuit section with reference to FIGS. 15A to 15C. In this case; to implant ions in the NMOS region, a resist pattern 32 (a first resist pattern) is not formed on the region, as shown in FIG. 15C. On the other hand, as shown in FIG. 15B, the resist pattern. 32 is formed on the memory cell section since ions should not be implanted in this section. As for the alignment mark section, as shown in FIG. 15A, the present embodiment does not form the resist pattern 32 on it even through ions need not be implanted therein.

Then, impurity ions are implanted using the resist pattern. 32 as a mask. At that time, the impurity ions are also implanted in the alignment mark section. However, no problem arises since they do not affect the transistor characteristics.

After implanting the ions, the portions of the silicon oxide films 22, 30, and 29 exposed at the openings of the resist pattern 32 are wet-etched before the resist pattern 32 is removed. The wet-etching may be achieved by use of phosphoric acid, etc. After that, the resist pattern 32, which is no longer necessary, is removed, producing the structures shown in FIGS. 16A to 16C. It should be noted that FIGS. 16A, 16B, and 16C show the alignment mark section, the memory cell section, and the peripheral circuit section, respectively.

Figure 14:
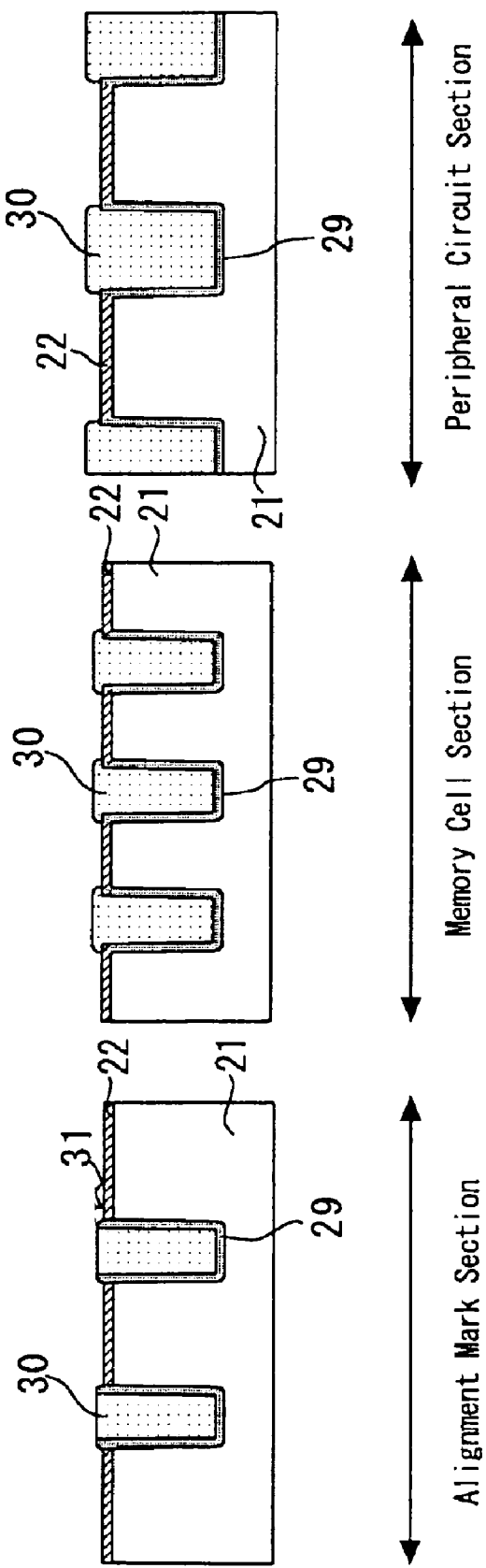
FIG. 14A is a cross-sectional view of the alignment mark section according to the second embodiment.
FIG. 14B is a cross-sectional view of the memory cell section according to the second embodiment.
FIG. 14C is a cross-sectional view of the peripheral circuit section according to the second embodiment.
Figure 15:
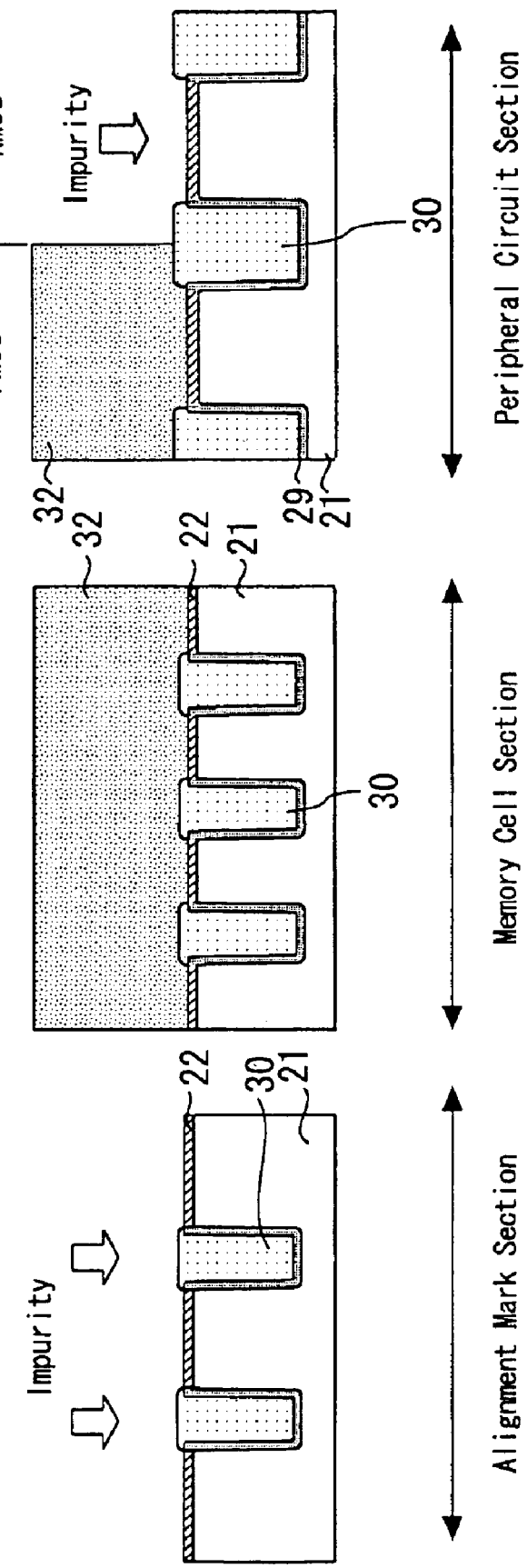
FIG. 15A is a cross-sectional view of the alignment mark section according to the second embodiment.
FIG. 15B is a cross-sectional view of the memory cell section according to the second embodiment.
FIG. 15C is a cross-sectional view of the peripheral circuit section according to the second embodiment.
Figure 16:
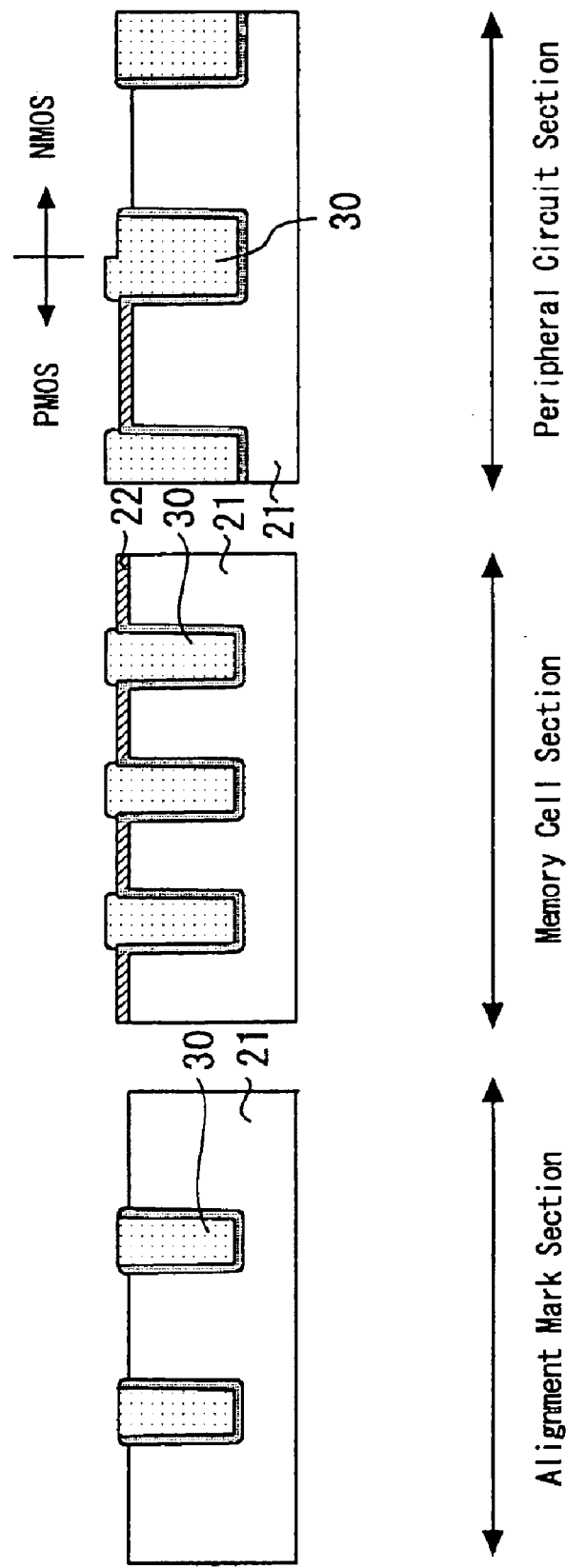
FIG. 16A is a cross-sectional view of the alignment mark section according to the second embodiment.
FIG. 16B is a cross-sectional view of the memory cell section according to the second embodiment.
FIG. 16C is a cross-sectional view of the peripheral circuit section according to the second embodiment.
Figure 17:
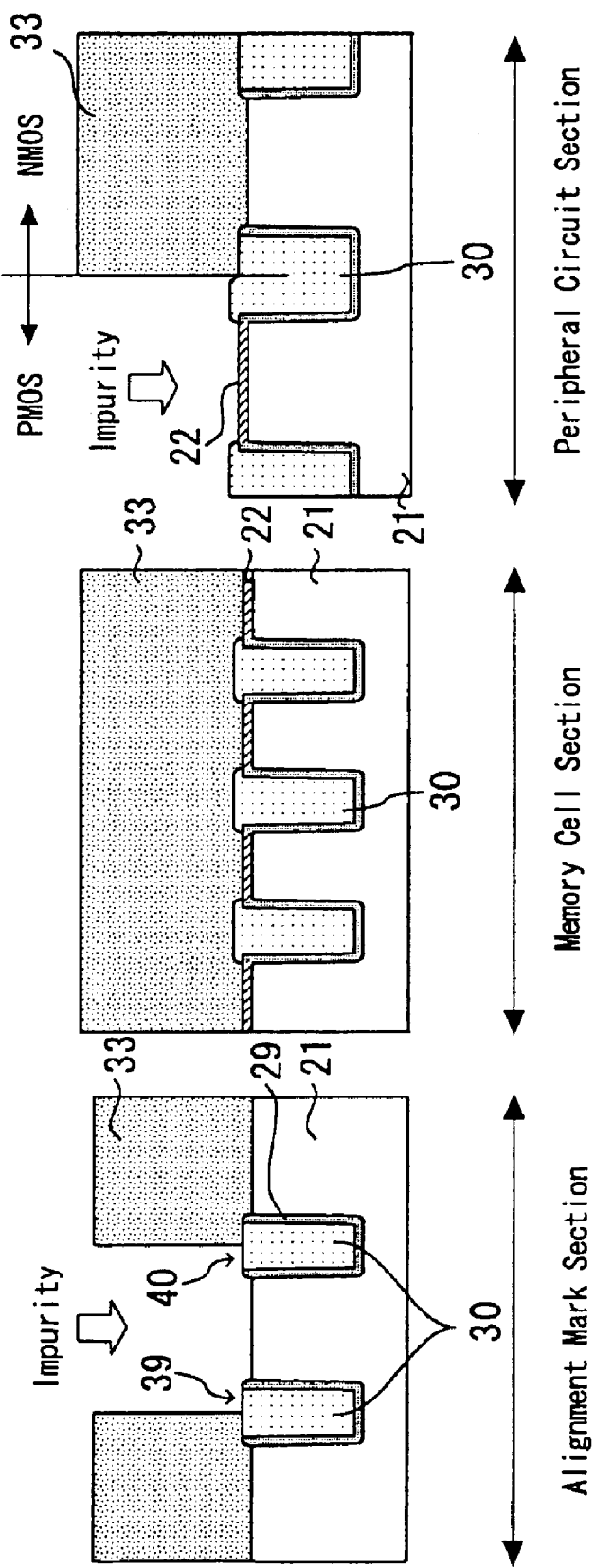
FIG. 17A is a cross-sectional view of the alignment mark section according to the second embodiment.
FIG. 17B is a cross-sectional view of the memory cell section according to the second embodiment.
FIG. 17C is a cross-sectional view of the peripheral circuit section according to the second embodiment.

The above wet-etching is stopped when the exposed portion of the silicon oxide film 22 (formed on the semiconductor substrate 21) has been removed, exposing the surfaces of the semiconductor substrate 21 in the alignment mark section and the NMOS region of the peripheral circuit section. At that time, the portions of the silicon oxide films 29 and 30 corresponding to the film thickness of the silicon oxide film 22 are also removed, along with the exposed portion of the silicon oxide film 22. In the above process, a step 31 having a height of h2 is formed at the boundary between the surface of the silicon oxide film 22 and that of the silicon oxide film 30, as shown in FIG. 14. Therefore, even after the portion of the silicon oxide film 30 corresponding to the film thickness of the silicon oxide film 22 has been removed, the surface of the silicon oxide film 30 is still higher than that of the semiconductor substrate 21 by h2. When the silicon oxide film 30 is removed by etching in a postprocess, this arrangement prevents the grooves formed by removing the oxide films from being processed such that they have an inverse tapered shape in cross-section, thereby preventing deterioration of the electrical characteristics of the transistors.

It should be noted that the height of the step provided at the boundary between the surfaces of the silicon oxide film 30 and the semiconductor substrate 21 need not necessarily be equal to that of the step at the boundary between the surfaces of the silicon oxide film 30 and the silicon oxide film 22 (h2). That is, the same effect can be obtained if the surface of the silicon oxide film 30 has a height equal to or more than that of the surface of the semiconductor substrate 21.

Then, as shown in FIGS. 7A to 7C, ions are implanted in the PMOS region of the peripheral circuit section using a resist pattern 33 as a second resist pattern. In this case, it is arranged that the resist pattern 33 is not formed on the area of the alignment mark section sandwiched by first and second grooves 39 and 40 (shown in FIG. 17A), as well as on the target implantation area (the PMOS region shown in FIG. 17C). It should be noted that the resist pattern 33 is formed on the NMOS region in which the semiconductor substrate 21 has been exposed. That is, the resist pattern 33 covers the NMOS region (in which the semiconductor substrate 21 has been exposed) and has openings over the PMOS region and the area sandwiched by the first and second grooves 39 and 40 in the alignment mark section.

Figure 18:
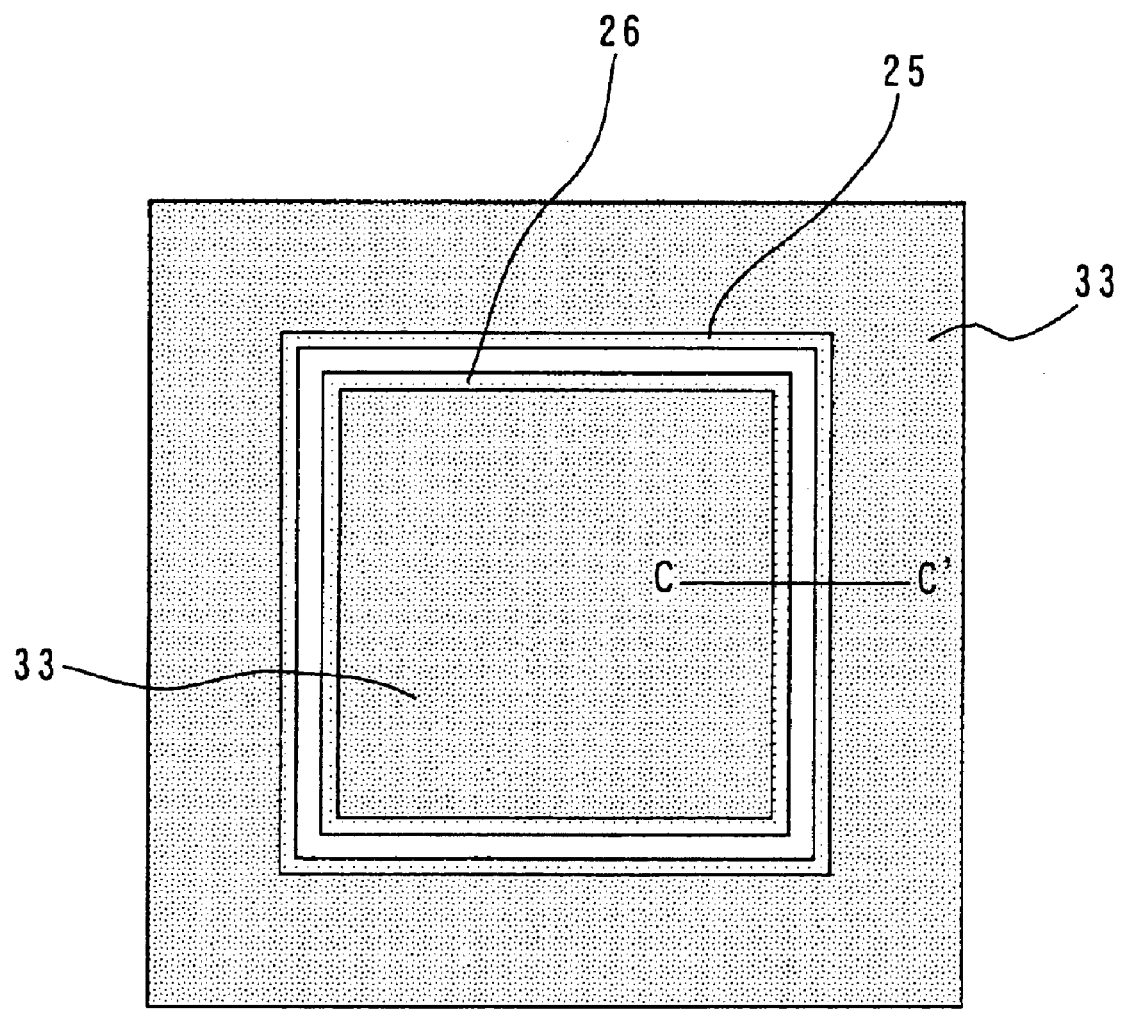
FIG. 18 is a plan view of the alignment mark section according to the second embodiment.
Figure 19:
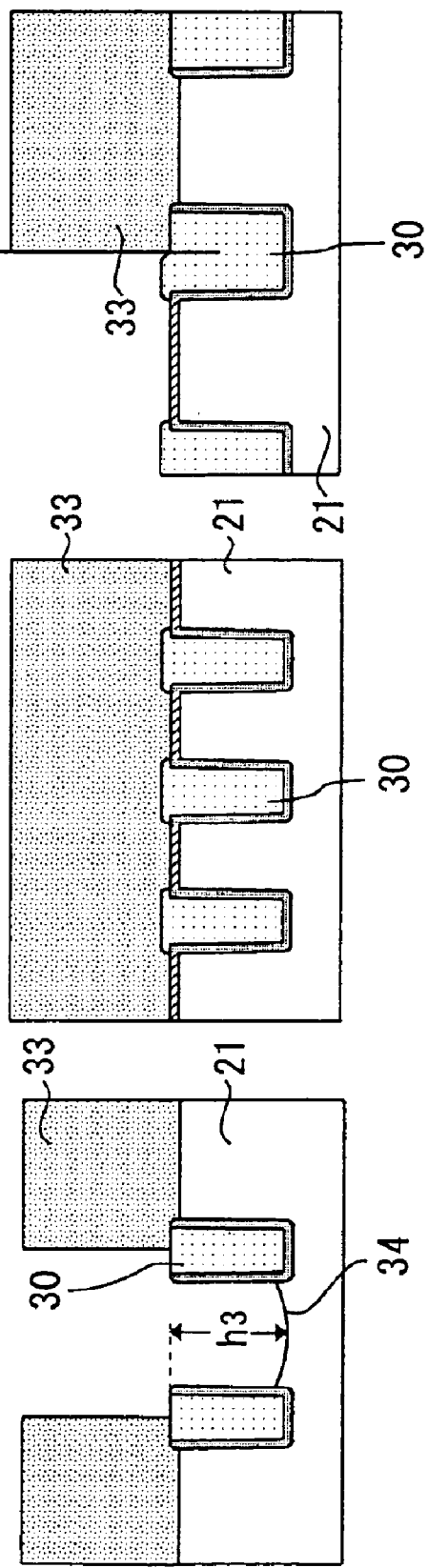
FIG. 19A is a cross-sectional view of the alignment mark section according to the second embodiment.
FIG. 19B is a cross-sectional view of, the memory cell section according to the second embodiment.
FIG. 19C is a cross-sectional view of the peripheral circuit section according to the second embodiment.
Figure 20:
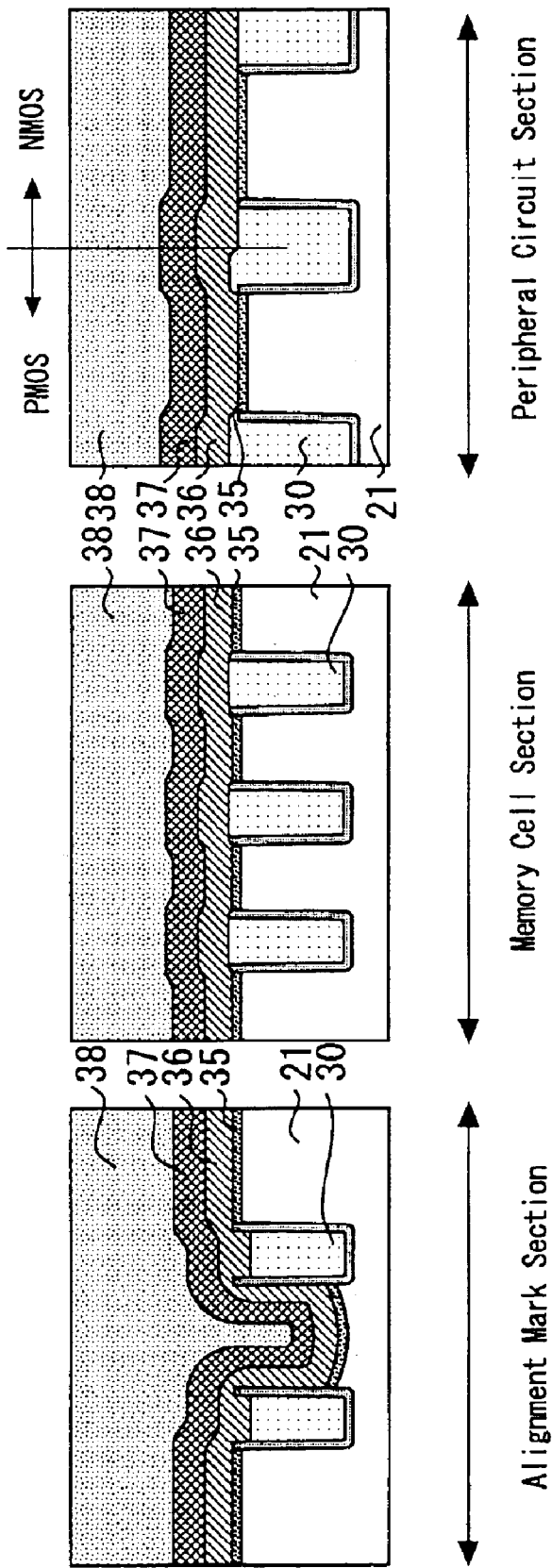
FIG. 20A is a cross-sectional view of the alignment mark section according to the second embodiment.
FIG. 20B is a cross-sectional view of the memory cell section according to the second embodiment.
FIG. 20C is a cross-sectional view of the peripheral circuit section according to the second embodiment.

FIG. 18 is a plan-view of the alignment mark section, and FIG. 17A is a cross-sectional view of the alignment mark section in FIG. 18 taken along line C–C'. As shown in FIG. 18, the resist pattern 33 is not formed on the area sandwiched by the first rectangular pattern 25 and the second rectangular pattern 26. The first rectangular pattern 25 corresponds to the second groove 40 in FIG. 17A, while the second rectangular pattern 26 corresponds to the first groove 39 in FIG. 17A.

After implanting ions in the PMOS region using the resist pattern 33 as a mask, as shown in FIG. 17C, the portion of the semiconductor substrate 21 exposed in the alignment mark section (shown in FIG. 17A) is wet-etched before the resist pattern 33 is removed. It should be noted that since the NMOS region is covered with the resist pattern 33, the semiconductor substrate 21 in the NMOS region is not etched. The etching is achieved by use of a chemical solution capable of selectively etching the semiconductor substrate 21. For example, if a silicon substrate is used as the semiconductor substrate 21, aqueous ammonia may be used. By using such a solution, only the semiconductor substrate 21 exposed in the alignment mark section can be etched without etching the silicon oxide films 22, 29, and 30 exposed in the PMOS region, producing the structures shown FIGS. 19A to 19C. It should be noted that FIGS. 19A, 19B, and 19C show the alignment mark section, the memory cell section, and the peripheral circuit section, respectively.

As a result, a concave portion (a step) having a predetermined depth is formed in the alignment mark section, as shown in FIG. 19A. The depth h3 of the concave portion is preferably set to a value large enough to detect the alignment mark, namely 50 nm or more.

When a silicon substrate is used as the semiconductor substrate 21 and aqueous ammonia is used for the etching, the bottom surface 34 of the groove formed in the alignment mark section has an arc-like shape in cross-section (downwardly concave around the center), as shown in FIG. 19A. On the other hand, the silicon substrate may be dry-etched. In this case, a gas having a high selectivity ratio against the silicon oxide films may be used to produce a substantially flat bottom surface 34, making it possible to further enhance the alignment accuracy.

After completing etching of the semiconductor substrate 21 in the alignment mark section, the resist pattern 33 is removed since it is no longer necessary. Then, a gate insulation film material 35, a gate electrode material 36, a hard mask material 37, and a resist film 38 are laminated in that order, producing the structures shown in FIGS. 20A to 20C. It should be noted that FIGS. 20A, 20B, and 20C show the alignment mark section, the memory cell section, and the peripheral circuit-section, respectively. After patterning the resist film 38 by use of a photolithographic technique, the hard mask material 37 is etched using the patterned resist film 38 as a mask, forming a hard mask. After that, the gate electrode material 36 and the gate insulation film material 35 are etched using the hard mask, forming the gate insulation films and the gate electrodes.

It should be noted that after forming the hard mask material 37, an antireflective film may be formed thereon. When the resist film formed on the antireflective film is patterned, the antireflective film absorbs the exposure light which has passed through the resist film, functioning to eliminate the reflection of the exposure light at the interface between the resist film and the antireflective film. A film mainly made of an organic substance and formed by the spin coat method, etc. may be used as the antireflective film.

Figure 21:
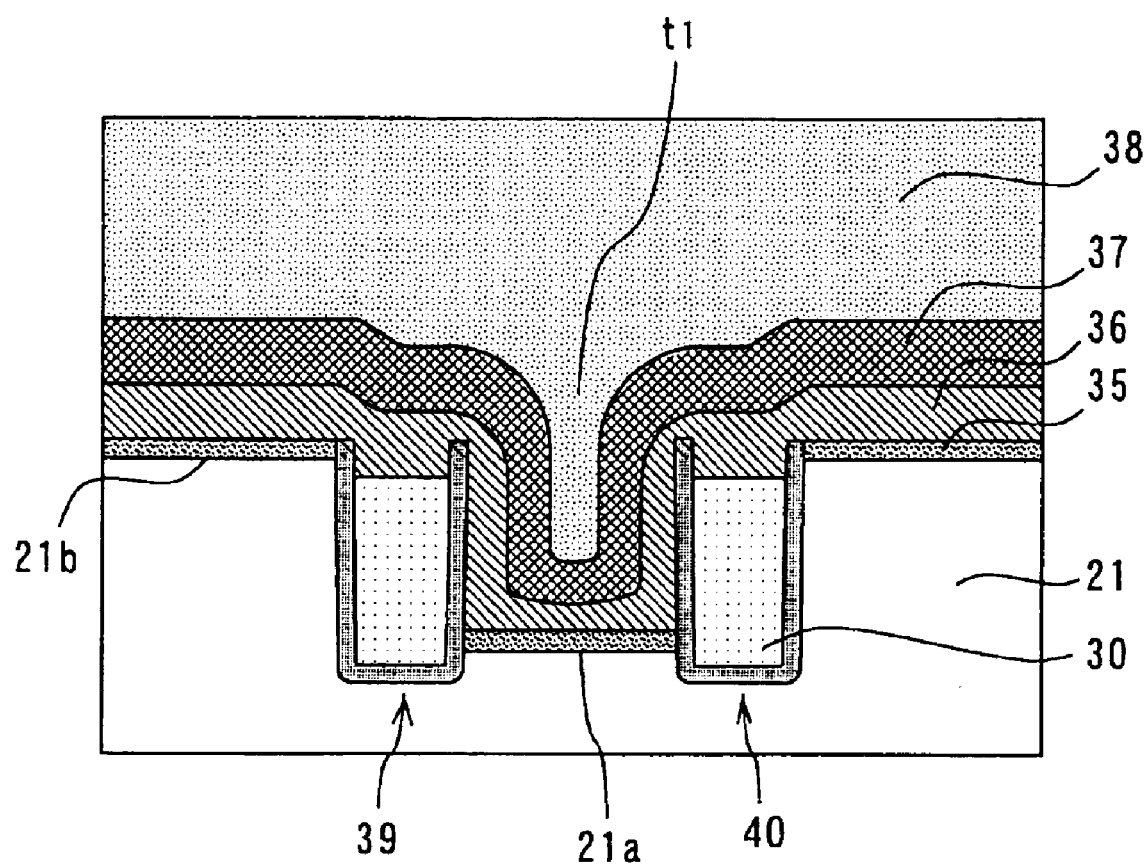
FIG. 21 is a cross-sectional view of the semiconductor device according to the second embodiment.
Figure 22:
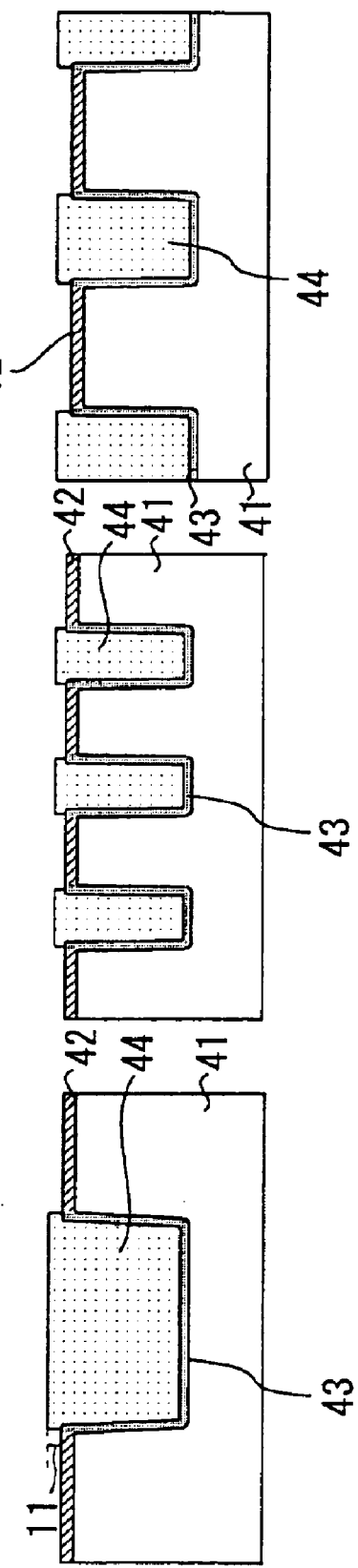
FIG. 22A is a cross-sectional view of the alignment mark section according to the third embodiment.
FIG. 22B is a cross-sectional view of the memory cell section according to the third embodiment.
FIG. 22C is a cross-sectional view of the peripheral circuit section according to the third embodiment.
Figure 23:
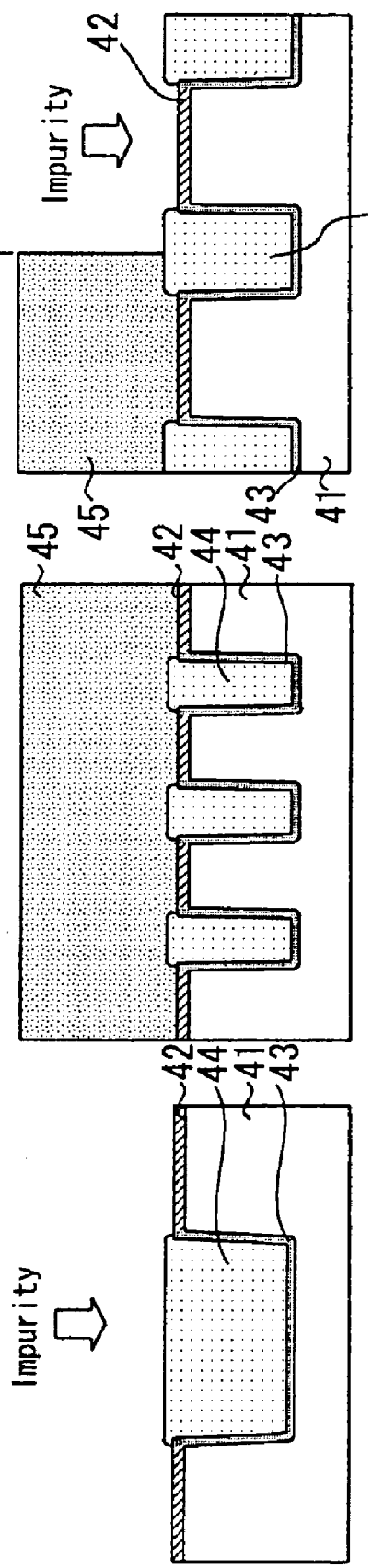
FIG. 23A is a cross-sectional view of the alignment mark section according to the third embodiment.
FIG. 23B is a cross-sectional view of the memory cell section according to the third embodiment.
FIG. 23C is a cross-sectional view of the peripheral circuit section according to the third embodiment.
Figure 24:
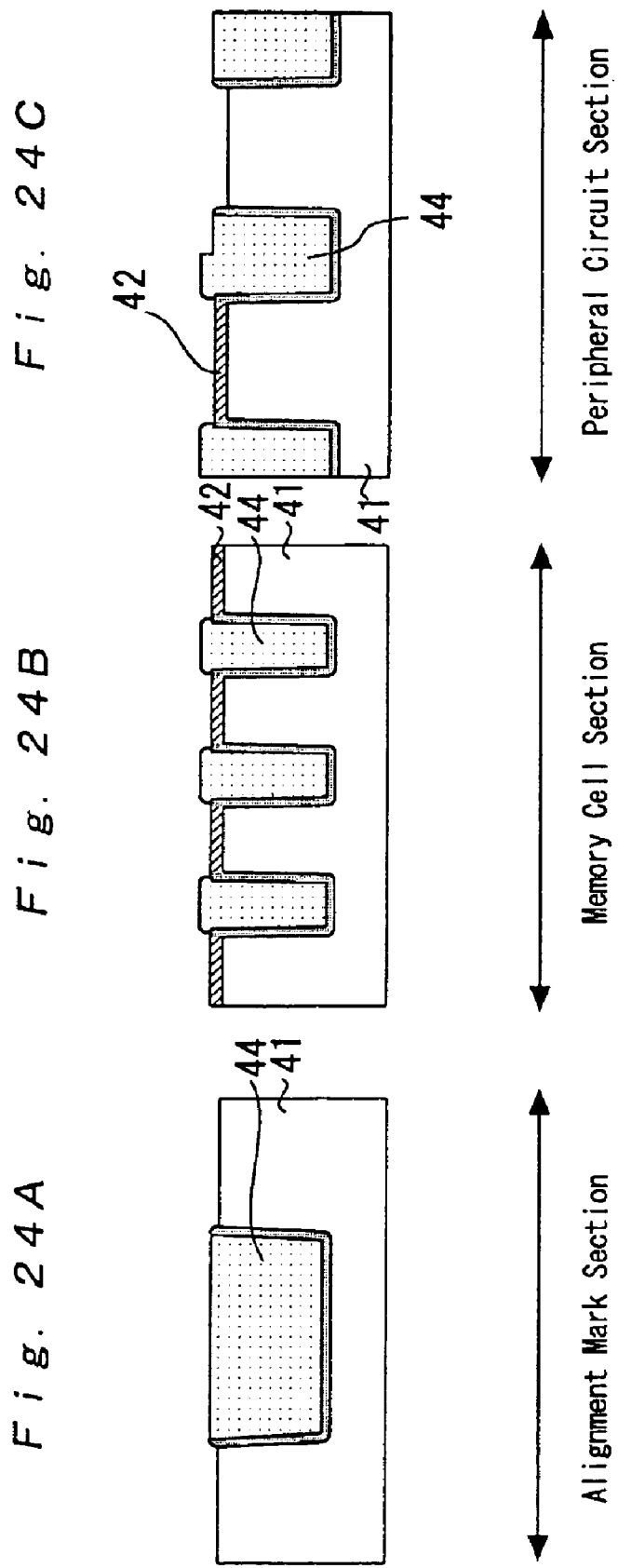
FIG. 24A is a cross-sectional view of the alignment mark section according to the third embodiment.
FIG. 24B is a cross-sectional view of the memory cell section according to the third embodiment.
FIG. 24C is a cross-sectional view of the peripheral circuit section according to the third embodiment.
Figure 25:
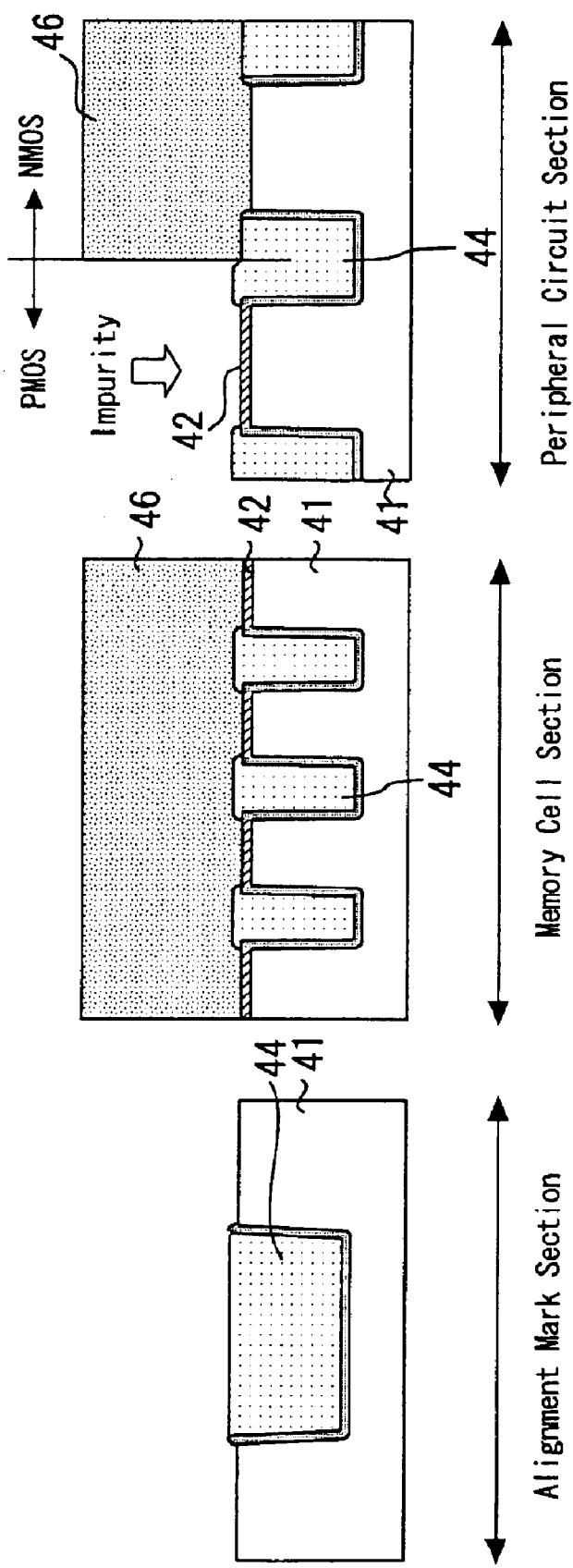
FIG. 25A is a cross-sectional view of the alignment mark section according to the-third embodiment.
FIG. 25B is a cross-sectional view of the memory cell section according to the third embodiment.
FIG. 25C is a cross-sectional view of the peripheral circuit section according to the third embodiment.

FIG. 21 is a cross-sectional view of an alignment mark section in which the gate insulation film material 35, the gate electrode material 36, the hard mask material 37, and the resist film 38 are laminated in that order after dry-etching the silicon substrate so as to form a flat bottom surface 34 as shown in FIG. 19A. As shown in FIG. 21, the surface 21a of the semiconductor substrate in the area sandwiched by the first and second grooves 39 and 40 is lower than the surface 21b of the semiconductor substrate in other areas, forming a step t1 having a predetermined depth in the alignment mark section.

According to the present embodiment, after forming the first rectangular pattern and the second rectangular pattern in the alignment mark section, ions are implanted in an implantation area and the alignment mark section. After that, the silicon oxide films in the implantation area and the alignment mark section are removed, exposing the semiconductor substrate therein. Then, when the next ion implantation is carried out, only the portion of the semiconductor substrate sandwiched by the above rectangular patterns is exposed. After the ion implantation, the exposed portion of the semiconductor substrate is etched, forming a concave portion having a predetermined depth in the alignment mark section. Therefore, it is possible to eliminate the photolithographic process for etching only the alignment mark section and thereby reduce the cost and the number of processes for manufacturing the semiconductor device. It should be noted that after forming the concave portion in the alignment mark section, ions can be implanted in other predetermined areas of the device formation section in the conventional manner. That is, each resist pattern used as a mask for implantation only need to have an opening over the target implantation area, and no opening is required over the alignment mark section.

Third Embodiment

The alignment mark section of a third embodiment of the present invention employs the same patterns as those shown in FIG. 2 described in connection with the first embodiment.

Description will be made of a method for manufacturing a semiconductor device according to the present embodiment with reference to FIGS. 22 to 27. It should be noted that in these figures, like numerals will be used to denote like components.

First of all, a first insulation film and a hard mask are sequentially formed on a semiconductor substrate of a first conductive type. Then, the first insulation film and the semiconductor substrate are etched using the hard mask, forming grooves having a predetermined depth in the alignment mark section and the device formation section of the semiconductor substrate. After burying a second insulation film into the grooves, the hard mask is removed. For example, as shown in FIGS. 22A to 22C, active region patterns are formed on a semiconductor substrate 41 of a first conductive type according to the processes shown in FIGS. 1 to 6 described with connection with the first embodiment. It should be noted that FIGS. 22A, 22B, and 22C show the alignment mark section, the memory cell section, and the peripheral circuit section, respectively. In these figures, reference numeral 42 denotes a silicon-oxide film used as a first insulation film, and 44 denotes another silicon oxide film used as a second insulation film. Further, reference numeral 43 denotes a silicon oxide film formed on the inside walls of the grooves in the alignment mark section and the device formation section. It should be noted that a silicon substrate may be used as the semiconductor substrate 41.

Then, channel doping is applied to the semiconductor substrate 41. Specifically, impurities of at least one of first and second conductive types are ion-implanted in desired areas using resist patterns formed by a photolithographic technique as masks. At that time, it is arranged that no resist pattern is formed also on the alignment mark section, as in the first embodiment.

For example, when ions are implanted in the NMOS region of the peripheral circuit section, a resist pattern 45 (a first resist pattern) is not formed on this region in order to implant ions in the region, as shown in FIG. 23C. On the other hand, as shown in FIG. 23B, the resist pattern 45 is formed on the memory cell section since ions should not be implanted in this section. As for the alignment mark section, as shown in FIG. 23A, the present embodiment does not form the resist pattern 45 on it even though ions need not be implanted therein. Then, impurity ions are implanted in the NMOS region using the resist pattern 45 as a mask. At that time, the impurity ions are also implanted in the alignment mark section. However, no problem arises since they do not affect the transistor characteristics.

After completing the implantation of ions, the portions of silicon oxide films 42, 43, and 44 exposed at the resist pattern 45 are wet-etched. The wet-etching may be achieved by use of hydrofluoric acid, etc. After that, the resist pattern 45 is removed since it is no longer necessary, producing the structures shown in FIGS. 24A to 24C. It should be noted that FIGS. 24A, 24B, and 24C show the alignment mark section, the memory cell section, and the peripheral circuit section, respectively.

The above wet-etching is stopped when the exposed portion of the silicon oxide film 42 (formed on the semiconductor substrate 41) has been removed, exposing the surfaces of the semiconductor substrate 41 in the alignment mark section and the NMOS region of the peripheral circuit section. At that time, the portions of the silicon oxide films 43 and 44 corresponding to the film thickness of the silicon oxide film 42 are also removed, along with the silicon oxide film 42. In the above process, a step may be formed at the boundary between the surface of the silicon oxide film 44 and that of the silicon oxide film 42 beforehand. With this, even after the silicon oxide film 42 has been removed, the surface of the silicon oxide film 44 can be set higher than that of the semiconductor substrate 41. When the silicon oxide film 44 is removed by etching in a postprocess, this arrangement prevents the grooves formed by removing the silicon oxide films from being processed such that they have an inverse tapered shape in cross-section, thereby preventing deterioration of the electrical characteristics of the transistors. It should be noted that the above step may be formed in the same manner as in the first embodiment. For example, after burying the silicon oxide film 44 into the grooves, the silicon oxide film 44 may be selectively etched until the height of its top surface from the bottom surface of the hard mask is reduced to a predetermined value (between 10 nm and 20 nm). After that, the hard mask may be removed since it is no longer necessary.

It should be noted that the height of the step provided at the boundary between the surfaces of the silicon oxide film 44 and the semiconductor substrate 41 need not necessarily be equal to that of the step at the boundary between the surfaces of the silicon oxide film 44 and the silicon oxide film 42. That is, the same effect can be obtained if the surface of the silicon oxide film 44 has a height equal to or more than that of the surface of the semiconductor substrate 41.

Then, as shown in FIGS. 25A to 25C, ions are implanted in the PMOS region of the peripheral circuit section using a resist pattern 46 as a second resist pattern. In this case, it is arranged that the resist pattern 46 is not formed on the alignment mark section, as well as on the target implantation area. It should be noted that the resist pattern 46 is formed on the NMOS region in which the semiconductor substrate 41 has been exposed. That is, the resist pattern 46 covers the NMOS region (in which the semiconductor substrate 41 has been exposed) and has openings over the PMOS region and the alignment mark section. For example, when a positive type resist is used, a mask is prepared which has a conventional mask pattern and furthermore an opening for letting light pass through to the alignment mark section. Then, the resist film is irradiated with light through the mask and developed, making it possible to form a resist pattern having openings over the target implantation area and the alignment mark section.

After implanting ions in the PMOS region using the resist pattern 46 as a mask, as shown in FIG. 25C, the portion of the semiconductor substrate 41 exposed in the alignment mark section (shown in FIG. 25A) is wet-etched before the resist pattern 46 is removed. It should be noted, that since the NMOS region is covered with the resist pattern 46, the semiconductor substrate 41 in the NMOS region is not etched. The etching is achieved by use of a chemical solution capable of selectively etching the semiconductor substrate 41. For example, if a silicon substrate is used as the semiconductor substrate 41, aqueous ammonia may be used.

By using such a solution, only the portion of the semiconductor substrate 41 exposed in the alignment mark section can be etched without etching the silicon oxide films 42, 43, and 44 exposed in the PMOS region. It should be noted that if a silicon substrate is used as the semiconductor substrate 41, it may be dry-etched by use of a gas having a high selectivity ratio against the silicon oxide films.

Figure 26:
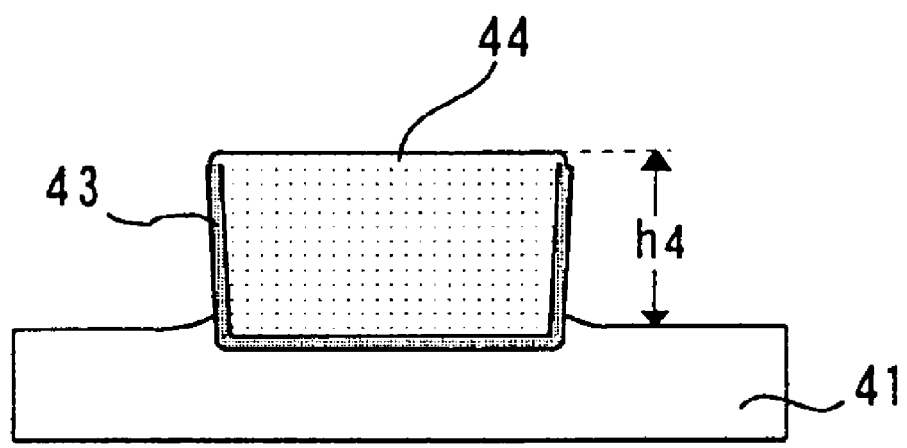
FIG. 26 is a cross-sectional view of the semiconductor device according to the third embodiment.
Figures 29A, 29B, 29C:
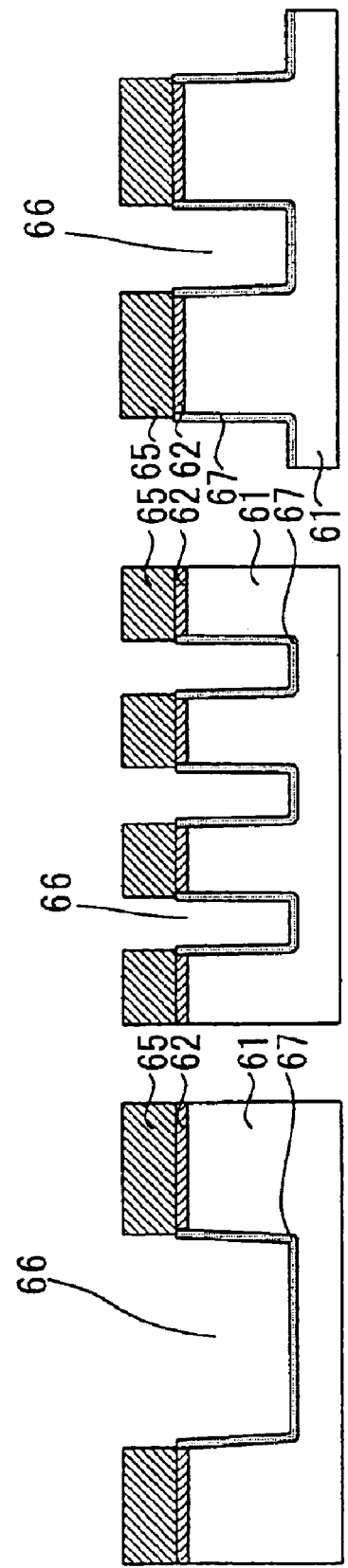
FIG. 29A is a cross-sectional view of the conventional alignment mark section.
FIG. 29B is a cross-sectional view of the conventional memory cell section.
FIG. 29C is a cross-sectional view of the conventional peripheral circuit section.
Figure 33C:
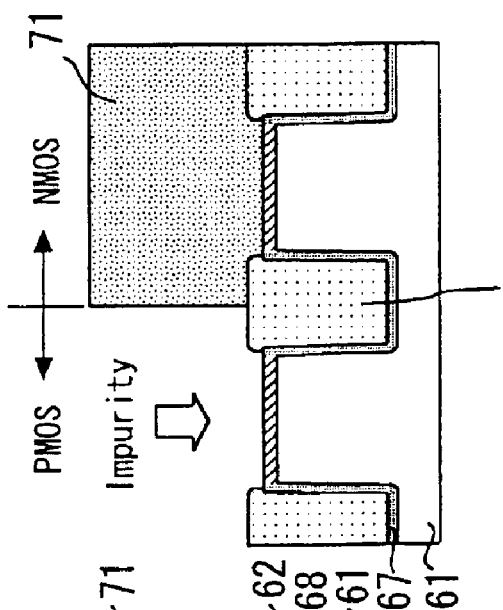
FIG. 33C is a cross-sectional view of the conventional peripheral circuit section.
Figure 33B:
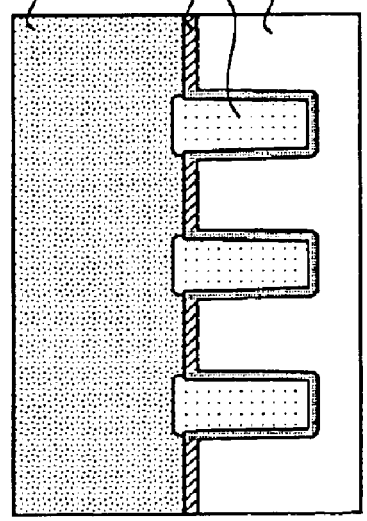
FIG. 33B is a cross-sectional view of the conventional memory cell section.
Figure 33A:
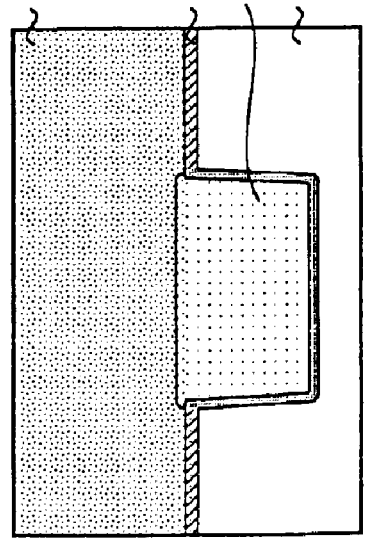
FIG. 33A is a cross-sectional view of the conventional alignment mark section.
Figures 35A, 35B, 35C:
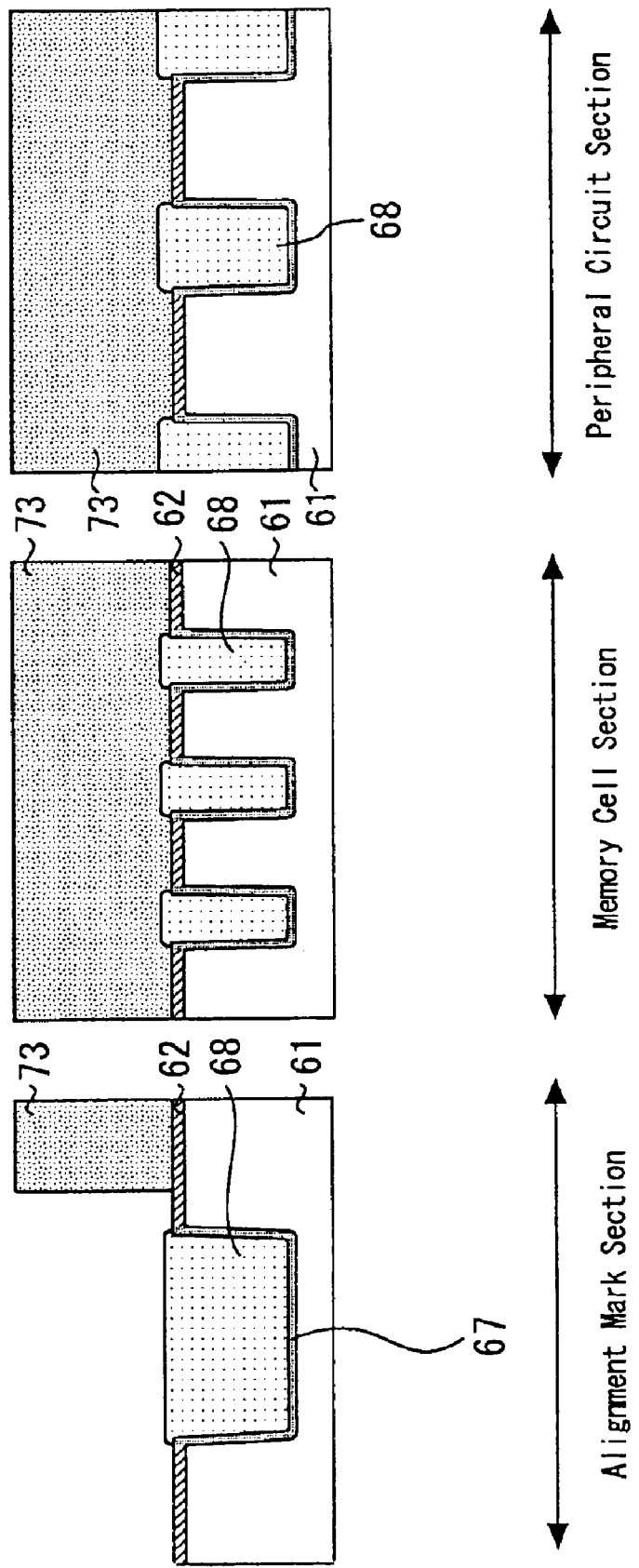
FIG. 35A is a cross-sectional view of the conventional alignment mark section.
FIG. 35B is a cross-sectional view of the conventional memory cell section.
FIG. 35C is a cross-sectional view of the conventional peripheral circuit section.

Thus, the semiconductor substrate 41 can be etched to form a convex portion (a step) having a predetermined height in the alignment mark section, as shown in FIG. 26. The height h4 of the convex portion (the depth of the step) is preferably set to 50 nm or more, which is large enough to detect the alignment mark. It should be noted that in FIG. 26, the convex portion corresponds to the groove formed in the alignment mark section, and the surface of the semiconductor substrate 41 surrounding the convex portion is lower than that of the semiconductor substrate 41 in the device formation section (see FIGS. 27A to 27C).

After completing etching of the semiconductor substrate 41 in the alignment mark-section, the resist pattern 46 is removed since it is no longer necessary. Then, a gate insulation film material 47, a gate electrode material 48, a hard mask material 49, and a resist film 50 are laminated in that order, producing the structures shown in FIGS. 27A to 27C. It should be noted that FIGS. 27A, 27B, and 27C show the alignment mark section, the memory cell section, and the peripheral circuit section, respectively. After patterning the resist film 50 by use of a photolithographic technique, the hard mask material 49 is etched using the patterned resist film 50 as a mask, forming a hard-mask. After that, the gate electrode material 48 and the gate insulation film material 47 are etched using the hard mask, forming the gate insulation films and the gate electrodes.

It should be noted that after forming the hard mask material 49, an antireflective film may be formed thereon. When the resist film formed on the antireflective film is patterned, the antireflective film absorbs the exposure light which has passed through the resist film, functioning to eliminate the reflection of the exposure light at the interface between the resist film and the antireflective film. A film mainly made of an organic substance and formed by the spin coat method, etc. may be used as the antireflective film.

According to the present embodiment, after implanting ions in an implantation area and the alignment mark section, the silicon oxide films in the implantation area and the alignment mark section are removed, exposing the semiconductor substrate therein. Then, when the next ion implantation is carried out, only the portion of the semiconductor substrate in the alignment mark section is exposed. After the ion implantation, the exposed portion of the semiconductor substrate is etched, forming a convex portion having a predetermined height in the alignment mark section. Thus, it is possible to eliminate the need for the mask and photolithographic process for etching only the alignment mark section and thereby reduce the cost and the number of processes. It should be noted that after forming the convex portion in the alignment mark section, ions can be implanted in other predetermined areas of the device formation section in the conventional manner. That is, each resist pattern used as a mask for implantation only need to have an opening over the target implantation area, and no opening is required over the alignment mark section.

The features and advantages of the present invention may be summarized as follows.

According to one aspect of the present invention described above, each resist pattern used for ion implantation is provided with openings over the alignment mark section as well as a target implantation area. With this arrangement, after the implantation, the insulation films exposed at the openings of the resist pattern are removed before removing the resist pattern. This process is repeated, thereby gradually removing the (entire) insulation films in the alignment mark section. As a result, a step having a predetermined depth can be eventually formed. Thus, it is possible to eliminate the photolithographic process for etching only the alignment mark section and thereby reduce the cost and the number of processes.

According to another aspect of the present invention, after forming first and second grooves in the alignment mark section, ions are implanted in an ion implantation area and the alignment mark section. After that, the insulation films in the implantation area and the alignment mark section are removed, exposing the semiconductor substrate therein. Then, when the next ion implantation is carried out, only the portion of the semiconductor substrate sandwiched by the first and second grooves is exposed. After the ion implantation, the exposed portion of the semiconductor substrate is selectively etched, forming a step having a predetermined depth in the alignment mark section. Thus, it is possible to eliminate the photolithographic process for etching only the alignment mark section and thereby reduce the cost and the number of processes.

According to still another aspect of the present invention, after implanting ions in an implantation area and the alignment mark section, the insulation films in the implantation area and the alignment mark section are removed. Then, when the next ion implantation is carried out, only the portion of the semiconductor substrate in the alignment mark section is exposed. After the ion implantation, the exposed portion of the semiconductor substrate is etched, forming a step having a predetermined height in the alignment mark section. Thus, it is possible to eliminate the photolithographic process for etching only the alignment mark section and thereby reduce the cost and the number of processes.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2003-382917, filed Nov. 12, 2003 including specification, claims, drawings and summary, on which the Convention priority of the present application is based, are incorporated herein by reference in its entirety.

What is claimed is:

1. A method for manufacturing a semiconductor device, comprising:

forming a first insulating film on a semiconductor substrate of a first conductivity type;

forming a hard mask on said first insulating film;

etching said first insulating film and said semiconductor substrate, using said hard mask, to form grooves having a predetermined depth in an alignment mark section and a device formation section of said semiconductor substrate;

burying a second insulating film in said grooves;

removing said hard mask;

forming a first resist pattern having openings at said alignment mark section and a first predetermined area of said device formation section;

ion-implanting impurities in said semiconductor substrate using said first resist pattern as a mask, the impurities producing at least one of first and second conductivity types in said semiconductor substrate;

removing a portion of said first insulation film exposed by said first resist pattern to expose said semiconductor substrate;

removing said first resist pattern;

forming a second resist pattern which covers the first predetermined area of said device formation section at which said semiconductor substrate is exposed, said second resist pattern having openings at said alignment mark section and a second predetermined area of said device formation section;

ion-implanting impurities in said semiconductor substrate using said second resist pattern as a mask, the impurities producing at least one of the first and second conductivity types in said semiconductor substrate;

selectively etching the portion of said semiconductor substrate exposed by said second resist pattern to form a convex portion having a predetermined height in said alignment mark section;

removing said second resist pattern;

forming a gate insulating film on said semiconductor substrate; and forming a gate electrode on said gate insulating film.

2. The method for manufacturing a semiconductor device according to claim 1, wherein height of said convex portion is at least 50 nm.

3. The method for manufacturing a semiconductor device according to claim 1, wherein:

said semiconductor substrate is a silicon substrate; and said first and second insulation films are silicon oxide films, including etching said semiconductor substrate with an aqucous solution of ammonia.

4. The method for manufacturing a semiconductor device according to claim 1, wherein:

said semiconductor substrate is a silicon substrate; and said first and second insulation films are silicon oxide films including etching said semiconductor substrate by dry-etching.

5. The method for manufacturing a semiconductor device according to claim 1, further comprising, after burying said second insulation film in said grooves, selectively etching said second insulating film until height of said second insulating film, from a bottom surface of said hard mask, is reduced to a predetermined value.

* * * * *